(12) United States Patent
Daughton et al.

(10) Patent No.: US 7,390,584 B2
(45) Date of Patent: Jun. 24, 2008

(54) SPIN DEPENDENT TUNNELING DEVICES HAVING REDUCED TOPOLOGICAL COUPLING

(75) Inventors: James M. Daughton, Eden Prairie, MN (US); Dexin Wang, Eden Prairie, MN (US)

(73) Assignee: NVE Corporation, Eden Prairie, MN (US)

( * ) Notice: Subject to any disclaimer, the term of this patent is extended or adjusted under 35 U.S.C. 154(b) by 0 days.

(21) Appl. No.: 10/394,950

(22) Filed: Mar. 21, 2003

(65) Prior Publication Data

US 2004/0013880 A1    Jan. 22, 2004

Related U.S. Application Data

(60) Provisional application No. 60/368,172, filed on Mar. 27, 2002.

(51) Int. Cl.
*G11B 5/39* (2006.01)
*G11B 5/127* (2006.01)

(52) U.S. Cl. ............... 428/811.2; 428/811.3; 428/811.5; 428/816; 360/324.12

(58) Field of Classification Search ................. 360/324, 360/324.1, 324.11, 324.12, 324.2; 428/692, 428/694 T
See application file for complete search history.

(56) References Cited

U.S. PATENT DOCUMENTS

| | | | |
|---|---|---|---|
| 5,508,867 A | | 4/1996 | Cain et al. |
| 6,127,053 A | | 10/2000 | Lin et al. |
| 6,201,673 B1 | * | 3/2001 | Rottmayer et al. ..... 360/324.12 |
| 6,271,997 B1 | * | 8/2001 | Gill .............................. 360/314 |
| 6,317,297 B1 | * | 11/2001 | Tong et al. .................. 360/314 |
| 6,418,048 B1 | * | 7/2002 | Sin et al. ..................... 365/173 |
| 6,462,919 B1 | * | 10/2002 | Mack et al. ............... 360/327.3 |
| 6,466,419 B1 | | 10/2002 | Mao |
| 6,473,275 B1 | * | 10/2002 | Gill .............................. 360/314 |
| 6,519,121 B1 | * | 2/2003 | Gill ........................ 360/324.11 |
| 6,531,723 B1 | | 3/2003 | Engel et al. |
| 6,545,906 B1 | | 4/2003 | Savtchenko et al. |
| 6,556,392 B1 | | 4/2003 | Mao et al. |
| 6,624,985 B1 | * | 9/2003 | Freitag et al. ............. 360/324.1 |
| 6,714,444 B2 | * | 3/2004 | Huai et al. ................... 365/171 |
| 6,724,586 B2 | * | 4/2004 | Gill .......................... 360/324.2 |
| 6,767,655 B2 | * | 7/2004 | Hiramoto et al. .......... 428/811.2 |
| 6,829,161 B2 | * | 12/2004 | Huai et al. ................... 365/158 |
| 6,838,740 B2 | * | 1/2005 | Huai et al. ................... 257/421 |
| 6,888,742 B1 | * | 5/2005 | Nguyen et al. .............. 365/158 |

(Continued)

OTHER PUBLICATIONS

Veloso, A. and Freitas, P., J. App. Phys., 87(9), 2000, 5744-5746.*

(Continued)

*Primary Examiner*—Kevin M Bernatz
(74) *Attorney, Agent, or Firm*—Kinney & Lange, P.A.

(57) ABSTRACT

A ferromagnetic thin-film based magnetic device with internal film coupling compensation including a nonmagnetic material intermediate layer with an initial thin-film of an anisotropic ferromagnetic material on one side. A compensation thin-film of an anisotropic ferromagnetic material is provided on the opposite side with an antiparallel coupling layer thereon and a subsequent thin-film of an anisotropic ferromagnetic material on the antiparallel coupling layer with the compensation thin-film being less thick than the subsequent thin-film. A antiferromagnetic layer can be supported by the layers on either side of the intermediate layer.

36 Claims, 10 Drawing Sheets

U.S. PATENT DOCUMENTS

| | | | |
|---|---|---|---|
| 2001/0009063 A1* | 7/2001 | Saito et al. | 29/603.08 |
| 2001/0050859 A1* | 12/2001 | Schwarzl | 365/158 |
| 2003/0206384 A1* | 11/2003 | Hoshiya et al. | 360/324.12 |
| 2004/0075953 A1* | 4/2004 | Gill | 360/314 |
| 2004/0115478 A1* | 6/2004 | Qian et al. | 428/692 |
| 2004/0212933 A1* | 10/2004 | Kim et al. | 360/324.11 |

OTHER PUBLICATIONS

Moon, K., Kim, J., Ro, J., Shong, E., Lee, S. and Kim, Y., IEEE Trans. Mag., 36(5), 2000, 2857-2859.*

Zhu (IEEE Trans. Mag., 35(2), Mar. 1999, 655-660).*

Kim, K., Jang, S., Shin, K., Kim, H., and Kang, T. (J. App. Phys., 89(11), Jun. 2001, 7612-7615).*

D. Wang, J.M. Daughton, D. Reed, W.D. Wang and J.-Q. Wang, "Magnetostatic Coupling in Spin Dependent Tunnel Junctions", *IEEE Transactions on Magnetics*, vol. 36, No. 5, pp. 2802-2805, Sep. 2000.

J.C.S. Kools and W. Kula, "Finite Magnetic Film Thickness on Néel Coupling in Spin Valves", *Journal of Applied Physics*, vol. 85, No. 8, pp. 4466-4468, Apr. 15, 1999.

J. Zhang and R.M. White, "Topological Coupling in Spin Valve Type Multilayers", *IEEE Transactions on Magnetics*, vol. 32, No. 5, pp. 4630-4635, Sep. 1996.

J.C.S. Kools, Th. G.S.M. Rijks, A.E.M. De Veirman and R. Coehoorn, "On the Ferromagnetic Interlayer Coupling in Exchange-Based Spin-Valve Multilayers", *IEEE Transactions on Magnetics*, vol. 31, No. 6, pp. 3918-3919, Nov. 1995.

L. Néel, "Magnétisme: Sur un probléme de magnétostatique relatif á des couches minces ferromagnétiques", *Comptes Rendus Académie des Sciences 255*, p. 1545, Oct. 1962. (English language translation also provided herewith: "Magnetism: On a New Method of Coupling Between the Magnetization of Two Tiny Ferromagnetic Layers", *Comptes Rendus Academy of Sciences*, translated Mar. 1993.).

\* cited by examiner

Externally Applied Field (Oe)

SPIN DEPENDENT TUNNELING DEVICES HAVING REDUCED TOPOLOGICAL COUPLING

CROSS-REFERENCE TO RELATED APPLICATION(S)

This application claims the benefit of Provisional Application No. 60/368,172 filed Mar. 27, 2002 for "SPIN DEPENDENT TUNNELING DEVICES HAVING ORANGE PEEL COUPLING REDUCTION STRUCTURES".

BACKGROUND OF THE INVENTION

The present invention relates to ferromagnetic thin-film structures and, more particularly, to ferromagnetic thin-film structures exhibiting relatively large magnetoresistive characteristics.

Many kinds of electronic systems make use of magnetic material based devices. Digital memories are used extensively in digital systems of many kinds including computers and computer systems components, and digital signal processing systems. Such memories can be advantageously based on the storage of digital bits as alternative states of magnetization in magnetic materials in each memory cell, particularly in cells using thin-film magnetic materials, resulting in memories which use less electrical power and do not lose information upon removals of such electrical power.

Magnetometers and other magnetic sensing devices are also used extensively in many kinds of systems including magnetic disk memories and magnetic tape storage systems of various kinds. Such devices provide output signals representing the magnetic fields sensed thereby in a variety of situations.

Such memory cells and sensors can often be advantageously fabricated using ferromagnetic thin-film materials, and are often based on magnetoresistive sensing of magnetic states, or magnetic conditions, therein. Such devices may be provided on a surface of a monolithic integrated circuit to provide convenient electrical interconnections between the device and the operating circuitry therefor.

In the recent past, reducing the thicknesses of the ferromagnetic thin-films and the intermediate layers in extended "sandwich" structures in which the two major surfaces of the intermediate layer each have thereon an anisotropic ferromagnetic thin-film layer, including those having additional alternating ones of such films and layers, i.e. superlattices, have been shown to lead to a "giant magnetoresistive effect" being present. This effect yields a magnetoresistive response which can be in the range of an order of magnitude or more greater than that due to the well-known anisotropic magnetoresistive response.

In the ordinary anisotropic magnetoresistive response, varying differences between the direction of the magnetization vector in the ferromagnetic film and the direction of the sensing current passed through the film lead to varying differences in the effective electrical resistance in the direction of the current. The maximum electrical resistance occurs when the magnetization vector in the film and the current direction are parallel to one another or antiparallel, while the minimum resistance occurs when they are perpendicular to one another. The total electrical resistance in such a magnetoresistive ferromagnetic film can be shown to be given by a constant value, representing the minimum resistance, plus an additional value depending on the angle between the current direction in the film and the magnetization vector therein. This additional resistance follows a square of the cosine of that angle.

As a result, operating external magnetic fields can be used to vary the angle of the magnetization vector in such a film portion with respect to the easy axis of that film portion. Such an easy axis comes about because of an anisotropy present in the film typically resulting from depositing that film in the presence of a fabrication external magnetic field oriented in the plane of the film along the direction desired for the easy axis in the resulting film or annealing such a film afterward in the presence of such a field. During subsequent operation of the device with the resulting film, such operating external magnetic fields can vary the angle to such an extent as to cause switching of the film magnetization vector between two stable states which occur as magnetizations oriented in opposite directions along that easy axis. The state of the magnetization vector in such a film portion can be measured, or sensed, by the change in resistance encountered by current directed through this film portion. This arrangement has provided the basis for a ferromagnetic, magnetoresistive anisotropic thin-film to serve as part of a memory cell.

In contrast to this arrangement, the resistance in the plane of a ferromagnetic thin-film is isotropic with respect to the giant magnetoresistive effect rather than depending on the direction of a sensing current therethrough as for the anisotropic magnetoresistive effect. The giant magnetoresistive effect has a magnetization dependent component of resistance that varies as the cosine of the angle between magnetizations in the two ferromagnetic thin-films on either side of an intermediate layer. In the giant magnetoresistive effect, the electrical resistance through the "sandwich" or superlattice is lower if the magnetizations in the two separated ferromagnetic thin-films are parallel than it is if these magnetizations are antiparallel, i.e. directed in opposing directions. Further, the also present anisotropic magnetoresistive effect in very thin-films is considerably reduced from the bulk values therefor in thicker films due to surface scattering, whereas very thin-films are a fundamental requirement to obtain a significant giant magnetoresistive effect.

In addition, as indicated, the giant magnetoresistive effect can be increased by adding further alternate intermediate and ferromagnetic thin-film layers to extend the "sandwich" or superlattice structure. The giant magnetoresistive effect is sometimes called the "spin valve effect" in view of the explanation that a larger fraction of conduction electrons are allowed to move more freely from one ferromagnetic thin-film layer to another if the magnetizations in these layers are parallel than if they are antiparallel with the result that the magnetization states of the layers act as sort of a valve.

These magnetizations results often come about because of magnetic exchange coupling between the ferromagnetic thin-films separated by the intermediate layers, these intermediate layers typically formed from a nonferromagnetic transition metal as an electrical conductor. The effect of the exchange coupling between the ferromagnetic thin-film layers is determined to a substantial degree by the thickness of such an intermediate layer therebetween. The effect of the coupling between the separated ferromagnetic thin-film layers has been found to oscillate as a function of this separation thickness between these layers in being ferromagnetic coupling (such that the magnetizations of the separated layers are parallel to one another) and antiferromagnetic coupling (such that the magnetizations of the separated layers are opposed to one another, or antiparallel to one another). Thus, for some separation thicknesses, the layer coupling can be of zero value between extremes of such oscillations.

Exhibiting the giant magnetoresistive effect in a superlattice structure, or in an abbreviated superlattice structure formed by a three layer "sandwich" structure, requires that there be arrangements in connection therewith that permit the establishment alternatively of both parallel and antiparallel orientations of the magnetizations in the alternate ferromagnetic thin-film layers therein. One such arrangement is to have the separated ferromagnetic thin-films in the multilayer structure be antiferromagnetically coupled but to a sufficiently small degree so that the coupling field can be overcome by an external magnetic field.

Another arrangement is to form the ferromagnetic thin-film layers with alternating high and low coercivity materials so that the magnetization of the low coercivity material layers can be reversed without reversing the magnetizations of the others. A further alternative arrangement is to provide "soft" ferromagnetic thin-films and exchange couple every other one of them with an adjacent magnetically hard layer (forming a ferromagnetic thin-film double layer) so that the ferromagnetic double layer will be relatively unaffected by externally applied magnetic fields even though the magnetizations of the other ferromagnetic thin-film layers will be subject to being controlled by such an external field.

One further alternative arrangement, related to the first, is to provide such a multilayer structure that is, however, etched into strips such that demagnetizing effects and currents in such a strip can be used to orient the magnetizations antiparallel, and so that externally applied magnetic fields can orient the magnetizations parallel. Thus, parallel and antiparallel magnetizations can be established in the ferromagnetic thin-films of the structure as desired in a particular use. Such a structure must be fabricated so that any ferromagnetic or antiferromagnetic coupling between separated ferromagnetic films is not too strong so as to prevent such establishments of film magnetizations using practical interconnection arrangements.

A magnetic field sensor suited for fabrication with dimensions of a few microns or less can be fabricated that provides a suitable response to the presence of very small external magnetic fields and low power dissipation by substituting an electrical insulator for a conductor in the nonmagnetic intermediate layer. This sensor can be fabricated using ferromagnetic thin-film materials of similar or different kinds in each of the outer magnetic films provided in a "sandwich" structure on either side of an intermediate nonmagnetic layer which ferromagnetic films may be composite films, but this insulating intermediate nonmagnetic layer permits electrical current to effectively pass therethrough based primarily on a quantum electrodynamic effect resulting in a "tunneling" current.

This "tunneling" current has a magnitude dependence on the angle between the magnetization vectors in each of the ferromagnetic layers on either side of the intermediate layer due to the transmission barrier provided by this intermediate layer depending on the degree of matching of the spin polarizations of the electrons tunneling therethrough with the spin polarizations of the conduction electrons in the ferromagnetic layers, the latter being set by the layer magnetization directions to provide a "magnetic valve effect". Such an effect results in an effective resistance, or conductance, characterizing this intermediate layer with respect to the "tunneling" current therethrough. The maximum fractional change in effective resistance is a function of the magnetic polarization of the conduction electrons given by $$(\Delta R/R) = 2P_1 P_2 / (1 - P_1 P_2)$$

where $P_1$ and $P_2$ are the conduction electron spin polarizations of the two ferromagnetic layers. These polarizations appear dependent on the ratio of spin up to spin down electrons in the 3D shell of the transition elements used in the ferromagnetic thin-films, i.e. the spin polarization P of the conduction electrons. The fraction f of 3D electrons which are spin up have typical values of 0.75 for iron, 0.64 for cobalt and 0.56 for nickel. Conduction electrons in metals are normally S shell electrons which theoretically would be equally divided between spin up and spin down electrons. However, because of band splitting the conduction electrons in the magnetic layers are assumed to have a fraction of spin up electrons like that of the electrons in the 3D shell. The spin polarization is then determined from $P = 2f - 1$.

In addition, shape anisotropy is often used in such a sensor to provide different coercivities in the two ferromagnetic layers, and by forming one of the ferromagnetic layers to be thicker than the other. Such devices may be provided on a surface of a monolithic integrated circuit to thereby allow providing convenient electrical connections between each such sensor device and the operating circuitry therefor.

A "sandwich" structure for such a spin dependent tunneling sensor, based on having an intermediate thin layer of a nonmagnetic, dielectric separating material with two major surfaces on each of which an anisotropic ferromagnetic thin-film is positioned, exhibits the "magnetic valve effect" if the materials for the ferromagnetic thin-films and the intermediate layers are properly selected and have sufficiently small thicknesses. The resulting "magnetic valve effect" can yield a response which can be several times in magnitude greater than that due to the "giant magnetoresistive effect" in a similar sized sensor structure.

The current-voltage characteristics of such "sandwich" structure sensors will exhibit a relatively linear change in the quantum electrodynamic effect "tunneling" current therethrough from one ferromagnetic layer through the barrier to the other with respect to the voltage provided across the sensor, i.e. across the barrier layer between these ferromagnetic layers, for relatively lower value voltages, but the current magnitude increases more than linearly for higher values of voltage across the sensor. As the voltage across the sensor increases, the fractional change in the "tunneling" current through the sensor, for the ferromagnetic layers having magnetizations changing from parallel to one another to antiparallel, decreases to being only half as great with several hundred millivolts across the sensor as occurs in the situation with a hundred or less millivolts across the sensor so that this fractional change with sensor voltage will range from a few percent to 20% or more. The fractional change in the resistance of the sensor for the ferromagnetic layers having magnetizations changing from parallel to one another to antiparallel increases to about one and one-half the room temperature values when the sensor is cooled to 77° K, but the "tunneling" current through the sensor increases by only about 10% to 20% indicating that the effective resistivity of the sensor is relatively insensitive to temperature (around 500 to 1000 ppm/° C.).

The effective resistivity of such a spin dependent tunneling sensor is set by the amount of "tunneling" current through the cell permitted by the barrier layer for the voltage across the sensor. The high sensitivity of the "tunneling" current to the thickness of the barrier layer leads to a wide range of sensor resistivities which have been observed to be from 60.0 $\Omega$-$\mu m^2$ to 10,000 $M\Omega$-$\mu m^2$. On the other hand, the barrier layer appears to permit relatively little magnetic coupling between the ferromagnetic layers thereacross with the coupling fields typically being only a few Oe.

The barrier material used for such sensing devices has typically been aluminum oxide, $Al_2O_3$ and other such oxides, but other dielectric materials have been used. A typical construction therefor has had two rectangular ferromagnetic thin-film strips with the barrier layer therebetween such that the long axis of the bottom strip, supported directly on an electrically insulating substrate, is at some angle with respect to that of the upper strip supported thereon through the barrier layer. This arrangement leaves the crossover area where these ferromagnetic strips overlap having the shape of a parallelogram defining the portion of the barrier layer through which there is effective current tunneling between the strips.

These devices are fabricated using semiconductor based integrated circuit chip fabrication techniques having a junction structure in a sensor cell based on a nonmagnetic intermediate separating material with two major surfaces on one of which is a base anisotropic ferromagnetic thin-film, which is also on or is a base electrode, and on the other of which there is at least one or possibly a plurality of separate anisotropic ferromagnetic thin-films but typically of differing effective coercivity with respect to the base film. The nonmagnetic intermediate separating material is an insulator for a spin dependent tunneling device and is typically $Al_2O_3$. Ones of the plurality of similar structures formed of separated ferromagnetic films can be interconnected to one another. The base electrode and the separated films can have lengths with gradually narrowing widths toward each end which narrow to zero at the ends. The intermediate material supported on a single base electrode can be common to all of these separated films thereon. The ferromagnetic layers in these structures are typically simple single films of Fe, Co, NiFe or other common ferromagnetic alloys.

The operating current for such sensors is typically supplied through a pair of current leads with one such lead connected to an end of the upper strip and the other lead connected to an end of the lower strip. The effective electrical resistance of the sensor is determined from measuring the voltage across the tunnel junction at two voltage leads each connected to one of the remaining two ends of these strips. Then, by providing a current of a known fixed value through the current leads and measuring the corresponding tunnel junction voltage on the voltage leads, the effective resistance can be simply calculated by dividing the measured voltage value by the chosen fixed current value.

As indicated above, the measured resistance of the tunnel junction in such a sensor is a function of the relative orientation of the magnetizations of the two ferromagnetic thin-film metal strips. The portion of the tunnel junction resistance that is subject to change as a result of that junction experiencing changes in external magnetic fields to which it is exposed is termed junction magnetoresistance (often written JMR, and defined as $\Delta R/R_{min}$ but is equivalently $\Delta V/V_{min}$ for voltage measurements with a fixed current with either being expressed as a percentage). The sensors described above demonstrated that the JMR therefor can be quite large at room temperature ($\cong$10 to 60%).

Often more than one such magnetic field sensor is used in a sensing configuration to provide a larger output signal and, in many instances, to provide some sensor noise cancellation. These goals are many times pursued through use of a bridge circuit in which such giant magnetoresistive effect structures or spin dependent tunneling structures are provided as circuit resistors connected in two parallel branches between two power supply nodes with each such branch having two such resistors in series with one another. A single polarity voltage source is typically connected between the two power supply nodes with in many instances the negative side of the source being grounded. A signal sensing differential amplifier with a pair of inputs is typically electrically connected between the two bridge circuit output nodes, i.e. the internal nodes of each of the two branches which for each is the node between the two resistors connected in series therein.

To have such a bridge circuit operate properly, adjacent ones of the magnetoresistors in the circuit must vary in resistance differently under an applied magnetic field if a signal output is to result. If they each have the same resistance variation, there will be a zero value signal developed between the bridge circuit output nodes, i.e. between the sensing amplifier inputs. Since an externally applied magnetic field to be sensed will be approximately the same for each of the closely spaced resistors in the bridge circuit, design measures are necessary to assure the needed resistive differences nevertheless occur between the adjacent circuit structures or resistors. One such measure previously used has been to place two of these magnetoresistors on opposite sides of the bridge circuit each connected to different power supply terminals under a magnetic shield leaving only the other two such resistors exposed to the effects of externally applied magnetic fields. Such an arrangement, however, allows determining the magnitude of an externally applied magnetic field in only one direction. Another such sensor must be provided to sense another field component.

A further variation of such a spin dependent tunneling sensor has the magnetization direction of one of the ferromagnetic layers on one side of the barrier layer pinned by an antiferromagnetic material layer provided thereon to thereby have its magnetization direction fixed relative to the remainder of the sensor as long as the magnitude of any external applied magnetic field is less than several times the maximum external field intended to be sensed. Again, the electrical resistance of the junction depends on the relative magnetization orientations of the two ferromagnetic layers with the resistance being low when the two magnetizations are parallel, and high when they are antiparallel. Therefore, the pinned magnetization direction layer becomes a magnetization direction reference in setting a pinned direction, and the magnetization orientation response of the free ferromagnetic layer to externally applied magnetic fields is translated into a corresponding change in the junction resistance. An electrical signal is again obtained between electrodes on the two ferromagnetic layers in connection with this manipulating of the magnetization direction of the free layer through an externally applied magnetic field.

Semiconductor integrated circuit chip fabrication techniques are again used for fabrication typically providing an integrated circuit based on silicon as a substrate for the spin dependent tunneling device sensors in a wafer supporting such devices thereon to result in having a typical basic wafer layer structure of Si(integrated circuit substrate)-$Si_3N_4$(200)-$Ni_{65}Fe_{15}Co_{20}$(12.5)-$Al_2O_3$(1.5 or less)-$Fe_{60}Co_{40}$(5.0)-$Cr_{45}Pt_{10}Mn_{45}$(30)(in nm). The $Al_2O_3$ barrier is formed by depositing a layer of metallic Al then oxidizing it in the plasma of $Ar/O_2$. A magnetic field of 20 Oe is applied during deposition of the ferromagnetic layers to induce the desired easy axes therein in a direction parallel to the pinned direction maintained by the antiferromagnetic material $Cr_{45}Pt_{10}Mn_{45}$.

A typical resulting structure of a chip from such a wafer is shown in the layer diagram of FIG. 1 which is not a true cross section views in that many dimensions therein are exaggerated or reduced for purposes of clarity. Typically, such a spin dependent tunneling sensing structure is provided on a semiconductor chip, 10, having suitable operating circuitry for the sensor arrangement provided in the resulting monolithic integrated circuit structure. An electrical insulating layer, 11, is formed on semiconductor chip 10.

A device conductivity enhancement base layer, 11', is then provided on insulating layer 11 followed with a ferromagnetic layer, 12, formed of permalloy (NiFeCo) being provided thereon so as together form the common bottom electrode with layer 12 serving as the device free magnetic layer in being relatively free to have its magnetization direction altered by externally applied magnetic fields. There may be a further ferromagnetic material layer, 13, provided in some form on layer 12 as part of the free magnetic layer such as a higher magnetic moment layer to enhance device performance at the barrier junction. An easy axis is provided for the common bottom electrode ferromagnetic layer 12, 13 typically parallel to the length of this structure though not necessarily so.

Thereafter, an intermediate or barrier layer, 14, of aluminum oxide ($Al_2O_3$) is provided on the common bottom electrode ferromagnetic layer 12, 13 which supports two corresponding separate top antiferromagnetic material and ferromagnetic material electrodes each of which is a separate pinned magnetization direction layer. Thus, all of these electrodes have to be of magnetic materials adjacent to the barrier that "sandwich" between the bottom and top ones of such the electrically insulating barrier layer.

Barrier layer 14 has two separate compound ferromagnetic thin-film layers thereon to form the two upper electrodes shown. These compound ferromagnetic thin-film layers are provided to have a net layer magnetization that, when fixed in orientation in the finally formed structure, will resist rotation from that orientation, and certainly resist firmly any rotation that could be sufficient to lead to a reversal in its orientation as a result of externally applied magnetic fields of up to 1000 Oe or more. These compound ferromagnetic thin-film layers are formed beginning with a ferromagnetic layer, 15, of cobalt iron (CoFe) alloy on first composite ferromagnetic layer 12, 13. Then a nonmagnetic layer, 16, of ruthenium (rhenium or copper could alternatively be used) is provided on layer 15 as a Ru antiferromagnetic coupling layer. Thereafter, another ferromagnetic layer, 17, of CoFe is provided on layer 16 to complete a synthetic antiferromagnet 15, 16, 17 as the reference layer for each upper electrode. A further antiferromagnetic material "pinning" layer exhibiting a substantial magnetic anisotropy can (or must for best performance) be deposited on layer 17 to strongly set the magnetization direction of composite layer 15, 16, 17 in the direction in which the resulting sensor cell is intended to sense external magnetic fields during use as a sensor. Hence, a $Cr_{45}Pt_{10}Mn_{45}$ pinning layer, 18, is provided on layer 17 with a selected magnetization direction. Then, a layer of aluminum is provided on pinning layer 18 to passivate the upper electrode and to allow electrical connections thereto for circuit purposes. A further layer, 20, is provided on layer 19 to serve as an etching termination layer in connection with subsequent etching steps not described here. The resulting pinned or top electrodes, 21, are provided having an easy axis of the antiferromagnetic layer, and so the easy axes of the ferromagnetic thin-films in the compound layers in each of pinned electrodes 21 either perpendicular or parallel to the direction of the longest extent of those structures. This choice depends on the desired device characteristics and is made in conjunction with the direction chosen for the easy axis of the common bottom electrode ferromagnetic layer 12, 13 forming the bottom electrode, 22, along with device conductivity enhancement base layer 11'. A tunnel junction structure, 23, comprises a base electrode 22 supporting a corresponding pinned electrode 21 separated therefrom by a corresponding barrier layer 14, with a base electrode 22 shown supporting two corresponding pinned electrodes 21 separated therefrom by a corresponding barrier layer 14 forming a sensor device.

Following the completion of sensor device structures 23, another layer of silicon nitride to form an insulating layer, 24. On insulating layer 24, a plurality of interconnections, 25, is provided for interconnecting sensor devices 23 and also for interconnecting them with electronic circuitry in the integrated circuits in semiconductor substrate 10 therebelow. Finally, a further insulating layer, 26, is provided over interconnections 25.

A typical tunnel junction magnetoresistive characteristic graph is given in FIG. 2A plotting magnetoresistance as a function of external magnetic fields applied along the easy axes of that pair of spin dependent tunneling junctions 23 having reference electrodes 21 supported on barrier layer 14 and common electrode 22 having the structure as specified above so that these fields are also applied parallel to the easy axis of composite free layer 12, 13. The characteristic exhibits that there are clearly two separate magnetoresistance states near zero values of the externally applied magnetic field as is needed for a magnetic memory device. These two states correspond to the parallel and antiparallel configurations of the free layer magnetization with respect to the pinned layer magnetization. The free layer magnetization flips back and forth from parallel to antiparallel with slight changes in the value of the externally applied magnetic field. A sensing device needs a more linear characteristic about the zero externally applied field point such as shown in the magnetoresistive characteristic graph of FIG. 2B which can be achieved for this device by using a biasing magnetic field therewith to force the free layer magnetization to initially be perpendicular to the free layer easy axis direction. When this "perpendicular bias" field is large enough to saturate the free layer magnetization in the perpendicular direction, the resistance vs. applied field characteristic becomes much more linear and has minimal hysteresis.

However, both of these characteristics are shifted along the externally applied magnetic field axis from being symmetrical about the zero values of such applied fields. Such a shift amounts effectively to a magnetic bias field being applied to the device to result in an asymmetric characteristic. The effective coupling field occurring in the device minor hysteresis loop characteristic representing the free layer for the switching device shown in FIG. 2A is about 6.7 Ge as measured from the offset of the center of the hysteresis loop to the zero field value.

When magnetic and nonmagnetic layers are deposited sequentially in a stack to form "giant magnetoresistance effect" (GMR) or spin dependent tunnelling (SDT) device structures like that shown in FIG. 1, the surfaces of the resulting layers are not perfectly flat, but instead have varying degrees of surface roughness. This surface roughness can lead to magnetostatic coupling between magnetic material layers. Such coupling is often termed as Néel coupling or topological coupling or "orange peel" coupling.

The magnetostatic coupling energy density J of two ferromagnetic material layers, having saturation magnetizations $M_s$ and $M_s'$, that are separated by a spacer or intermediate layer formed from a nonmagnetic material with thickness t having a surface roughness that, as an example, can be modeled as a two dimensional sinusoidal waviness with an amplitude h and a wavelength w, is given by $$J = \frac{\pi^2}{\sqrt{2}} \frac{h^2}{w} (\mu_0 M_s M_s') e^{-\frac{2\pi\sqrt{2}}{w}t}$$

A schematic of a layer structure is given in FIG. 3A depicting two ferromagnetic material layers of infinite thickness separated by a finite thickness (t) spacer or intermediate layer of nonmagnetic material with each layer having such a sinusoidal surface roughness, a situation which tends to repeat in a subsequent layer surface as it is formed on the rough surface of a previously formed layer. This occurs because the subsequent layer, in being deposited on the rough surface of the previously formed layer in the stack, must fill in the surface depressions in that surface and cover the surface bumps thereof. Thus, the profile of the exposed surface of this subsequent layer tends to repeat the profile of the surface of the layer on which it is being deposited. This layer structure shown in FIG. 3A is the basis for the equation given above.

The derivation of this equation makes two reasonable assumptions to simplify calculations. One assumption is that a sinusoidal function is a good representation of the rough surface of a real magnetic thin-film. To the extent that the undulations in a real film do not exactly follow a sinusoidal form, the physical interaction being calculated will not exactly match the numbers obtained from this equation. However, two qualitative results are valid because they depend upon the conformal nature of the surfaces, and not the wave shapes. The key qualitative results are that the topological coupling between films decreases exponentially as the separation, t, between the two films increases, and that such coupling is proportional to the square of the roughness amplitude, h. If a triangle wave is used rather than a sine wave to represent the surface topology, for instance, these qualitative relationships would still be the same. The other assumption is that the two dimensional topology in the plane of the film can be described by a single wavelength. The equation above is actually a simplified version of a derivation that allows for different wavelengths along the two in-plane directions. However, there is no reason to think that the grain structure looks any different going along different orthogonal directions, i.e. the x or y directions. Such anisotropy in the grain structure would only come about through specific conditions of film growth like an anisotropic substrate surface (with atomic steps along one axis, for instance) or a rolling process, etc. In summary, if there is magnetic/non-magnetic/magnetic sandwich with a conformal "bump", the resulting magnetic interaction between the two closest ferromagnetic surfaces is a positive one, in that it results in trying to align the magnetization orientation in the two layers.

So far, only two ferromagnetic surfaces have been included in the calculation because the assumption has been made that the outer ferromagnetic surfaces are very far away to the point where the magnetic intereactions with those surfaces are negligible, or that the other surfaces have no roughness (appropriate for the starting surface). The effects of multiple nearby surfaces on a surface can be calculated by summing the effects of each nearby surface for the effect at the surface of interest through entering the appropriate separation, t, between the two surfaces using the same equation given above.

Another note, the equation above results in a surface energy density. In order to convert this to an effective magnetic field bias upon a given ferromagnetic layer such as the free layer, a conversion must be provided through dividing by the factor $\mu_0 Mt_{free}$. Thus, $H_{coupling} = J/\mu_0 Mt_{free}$.

The layer structure given in FIG. 3B depicts two ferromagnetic material layers in which one is of finite thickness and the other is of infinite thickness with them again being separated by a finite thickness (t) nonmagnetic spacer layer and each again having a sinusoidal surface roughness. FIG. 3C shows a synthetic antiferromagnet in place of the finite thickness upper magnetic material layer of FIG. 3B (formed of a pair of top (TFM) and bottom (BFM) ferromagnetic films tightly antiparallel coupled to one another by virtue of a thin ruthenium layer therebetween) and a thick ferromagnetic material layer as a "free layer" on the opposite side of an aluminum oxide barrier layer in place of the infinite thickness lower magnetic material layer of FIG. 3B. The roughness profile of the surfaces at the layers interfaces, and the thickness of the spacer layer as well as the thicknesses of magnetic material layers in setting the interface separations are the controlling factors for Néel coupling.

If the interface roughnesses are conformal to one another because of the surface profiles tending to repeat from layer to layer in the stack, the lower energy state is when the two magnetic material layer magnetizations are parallel. The coupling magnetic fields, extending from the magnetic free poles of opposite polarities that tend to accumulate on the opposite sides of surface roughness caused outward protuberances in surfaces of magnetized magnetic material layers at layer interfaces in "giant magnetoresistive effect" and spin dependent tunneling structures, act as magnetic biasing fields. In the situation of magnetic material layers which have the magnetization thereof fixed in orientation, or pinned, the magnetic bias fields extending therefrom to other layer surfaces in the stack of layers are constant in nature, and do not depend on the magnetization state of intersected unpinned, or free, magnetic material layers because of being determined by the surface roughness conditions only. Since the outward protuberances in surfaces of magnetized magnetic material layers at layer interfaces on one side of a magnetic material layer tend to conform to a corresponding depression in the layer surface across the layer therefrom, the magnetic polarities on opposite sides of a magnetic material layer are oppositely directed. Thus, a coupling field from another layer adds to the coupling field generated at one intersected magnetic material layer surface and subtracts from the coupling field generated at the opposite layer surface.

There are undesirable effects of such orange peel coupling on the behavior of various magnetic material layer devices in which this coupling occurs. In low external magnetic field sensors, orange peel coupling effectively applies a bias magnetic field on the active part of the sensor where the free layer is under the pinned layer and not in the bordering free layer outside the pinned layer. This makes it impossible to bias the free layer to get optimum sensitivity as both portions cannot be biased equally. In the case of a sandwich tunneling magnetoresistive memory cell, orange peel coupling provides a bias in favor of one of the two memory states thus requiring a higher current to write both magnetic states since the same magnitude current will be used for each. Thus, there is a desire to overcome such unwanted topological coupling or orange peel based biasing of the ferromagnetic layers in such devices.

BRIEF SUMMARY OF THE INVENTION

The present invention provides a ferromagnetic thin-film based magnetic device with internal film coupling compensation including a nonmagnetic material intermediate layer having two major surfaces on opposite sides thereof with an initial thin-film of an anisotropic ferromagnetic material on one of those intermediate layer major surfaces. A compensation thin-film of an anisotropic ferromagnetic material is provided on that remaining one of the intermediate layer major surfaces with an antiparallel coupling layer thereon and a subsequent thin-film of an anisotropic ferromagnetic material on the antiparallel coupling layer with the compensation thin-film being less thick than the subsequent thin-film. A antiferromagnetic layer can be supported by the layers on either side of the intermediate layer.

DETAILED DESCRIPTION

Figure 3A:
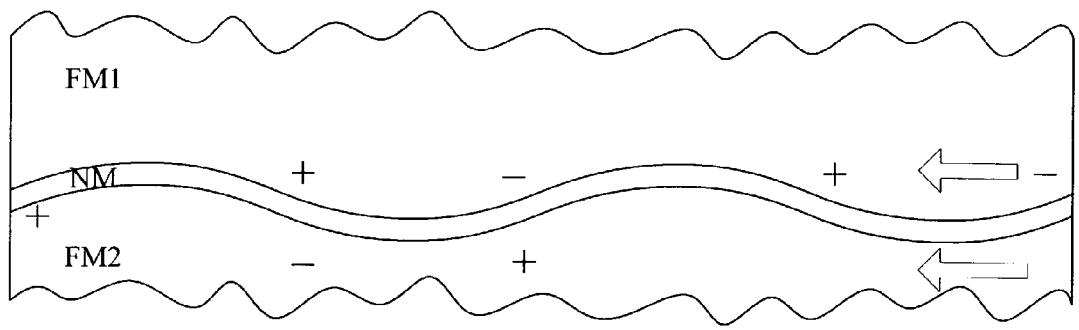
FIGS. 3A, 3B and 3C show schematic diagrams of layer structures.
Figure 3B:
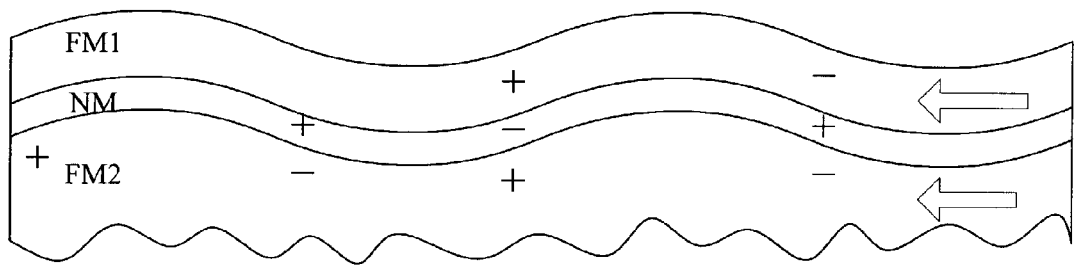
Figure 3C:
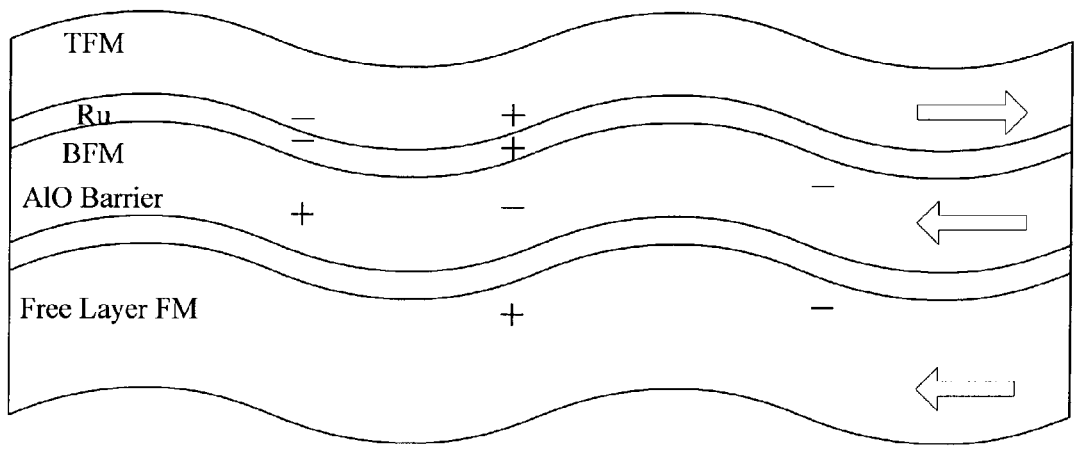
Figure 4A:
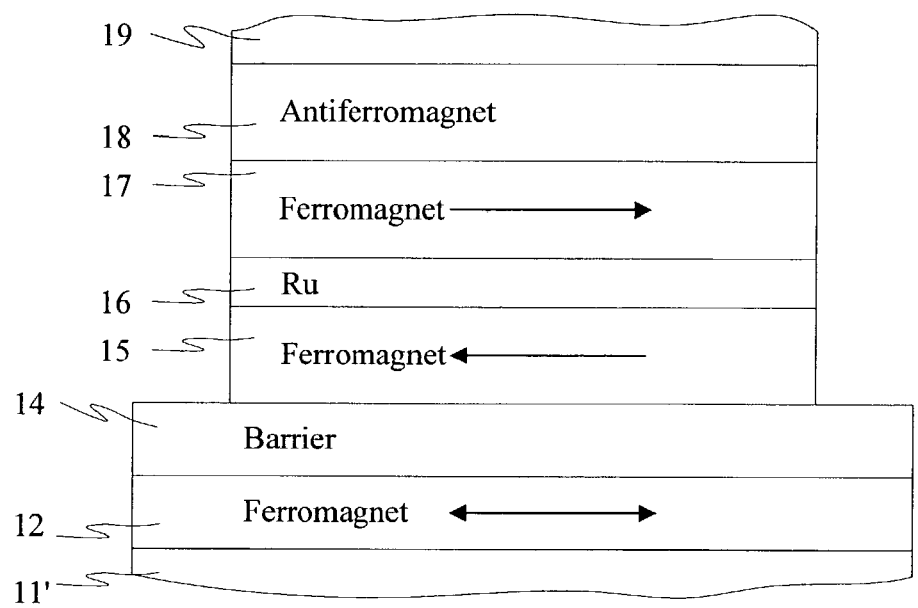
FIG. 4A shows a layer stack representation diagram corresponding FIG. 1.

A spin dependent tunneling sensing device is represented in the layer stack representation diagram of FIG. 4A with broken away electrodes as indicated by wavy lines. In this diagram, which is closely associated with the layer diagram of FIG. 1 (as indicated through use of the same numerical designations for comparable portions in each) and with the layer schematic of FIG. 3C, there is a several Oe coupling field between the bottom surface of ferromagnetic layer 15 above tunneling barrier 14 and the top surface of ferromagnetic layer 12 below that barrier. Layer magnetization direction possibilities are indicated by arrows in the corresponding ferromagnetic layer. Ferromagnetic layer 15 above barrier 14 is part of a pinned synthetic antiferromagnet (SAF), and the coupling field emanating therefrom is applied, effectively, as a constant field on ferromagnetic layer 12 under barrier 14. As described above, the origin of the coupling field is believed to be the spatially correlated roughnesses of the surfaces of ferromagnetic thin-films or layers 12 and 15 on either side of barrier 14. This creates a tendency for free magnetic poles to form at the surfaces in such a manner as to bias the magnetization of free layer film 12 in the direction of the magnetization of film 15. Although the magnetization of film 12 may be switched back and forth, or rotated, by externally applied magnetic fields during use, there is always an effective bias field (to the left with the orientation shown in the figure). Complete analysis of the coupling field would require taking into account all surfaces, but since the magnitudes of these fields decay exponentially with distance (here thickness t) as indicated above, the other coupling fields are smaller, and they alternate in polarity as indicated in the diagram to thereby partially offset one another, and are thus ignored.

Figure 4B:
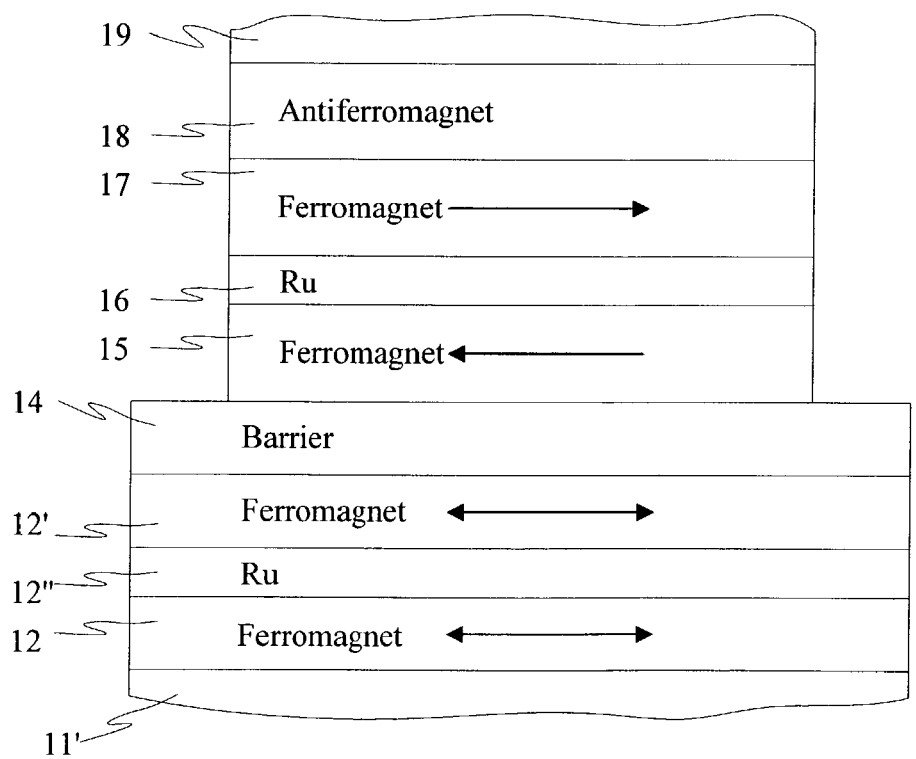
FIG. 4B shows a layer stack representation diagram embodying the present invention.
Figure 5:
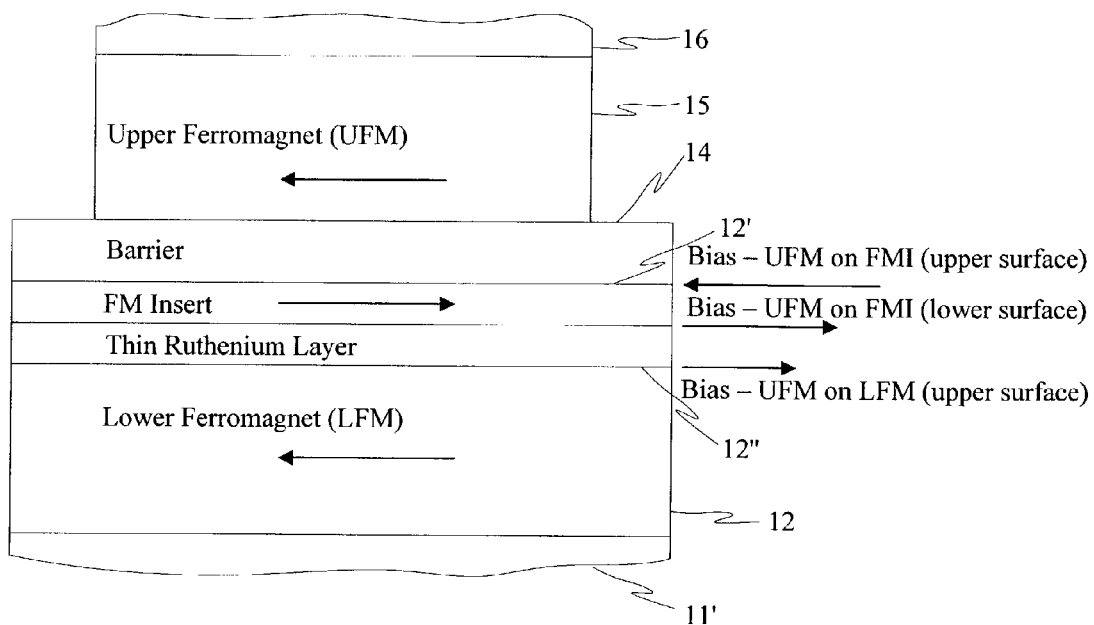
FIG. 5 shows an analytical diagram corresponding to the layer stack representation diagram of FIG. 4B.

The structure in the layer stack representation diagram of FIG. 4B (again with electrode terminations shown by wavy lines and ferromagnetic material layer magnetization direction possibilities represented by arrows in the corresponding layer) represents an improvement for such spin dependent tunneling sensing devices in which a thin ferromagnetic material layer insert, 12', as a topological, or orange peel, coupling compensation layer and a ruthenium layer, 12", as an antiparallel coupling layer are both added to the device layer stack immediately below tunneling barrier 14. This added layer of ruthenium is selected to be of a thickness so that there a strong antiferromagnetic coupling results between the magnetizations of ferromagnetic material layers 12' and 12 positioned below barrier 14. If the surface roughnesses of these two ferromagnetic material layers below barrier 14, and of ruthenium layer 12" below barrier 14, and of the bottom surface of ferromagnetic material layer 15 immediately above barrier 14 are again all spatially correlated with one another, then the coupling fields between the lower surface of ferromagnetic material layer 15 above barrier 14 and the surfaces of ferromagnetic material layers 12' and 12 below barrier 14 can be reduced or nulled out by appropriately selecting the thickness of thin ferromagnetic material layer insert 12' added under barrier layer 14 as demonstrated in the analytical diagram shown in FIG. 5 for the stack structure shown in the layer stack representation diagram of FIG. 4B in a selected one of the device magnetization states. The effective bias magnetic fields due to topological or orange peel coupling are represented to the right of the stack structure by arrows indicating direction and relative magnitude in this analytical diagram.

The magnetic bias from the lower surface of upper ferromagnetic material layer 15 (also designated UFM in FIG. 5) on the top surface of ferromagnetic material insert layer 12' (also designated FMI in FIG. 5) due to orange peel coupling would be approximately the same as was exerted on the top surface of lower ferromagnetic material layer 12 (also designated LFM in FIG. 5) in the FIG. 4A structure. But the bias from the UFM on the lower surface of the FMI due to such coupling is of opposite polarity, as indicated above, and this bias is close in magnitude to its value at the upper surface of the FMI because the FMI is thin. The coupling from the lower surface of the UFM to the upper surface of the LFM would be somewhat close in magnitude to the bias from the UFM to the lower surface of the FMI because the Ru layer is thin, and would be in the same direction. These latter two biases on the lower surface of the FMI and the upper surface of the FMI can be selected, through selecting the thickness of the FMI, to combine so as to effectively cancel one another of the various biases on the upper surface of the LFM so they total to a small or zero value, i.e. reduce or eliminate such topological or "orange peel" coupling. Because the effects of the other surfaces in the UFM and the bottom of the LFM decrease exponentially with separation distance from the top surface of the LFM they are ignored. Also, the bias effects of surfaces of the FMI on the top surface of the LFM, and the bias effects of the top surface of the LFM on the surfaces of the FMI, and other surface bias effects of surfaces in the free layer beneath the barrier all substantially cancel.

An alternative structure for spin dependent tunneling sensing devices which also reduces topological coupling between ferromagnetic material device layers is shown in the combined layer stack representation diagram and analytical diagram of FIG. 6 again shown with broken away electrodes. There, a ferromagnetic material layer insert, 15', again termed a FMI layer and again serving as a coupling compensation layer, is provided above and immediately next to barrier layer 14. A thin ruthenium layer, 15", again serving as an antiparallel coupling layer, is further provided above barrier 14 on this ferromagnetic film insert and also next to a bottom ferromagnetic material layer, 15''', of the pinned synthetic antiferromagnet structure provided above barrier 14 so that layers 15' and 15''' are strongly antiparallel coupled to one another by virtue of this thin ruthenium layer 15" therebetween. Layer 15''' is also indicated as the upper ferromagnet (UFM) with respect to barrier 14 with layer 17 designated in FIG. 6 as the Top FM, and layers 15''', 16 and 17 form the synthetic antiferromagnet along with antiferromagnetic material layer 18.

Figure 6:
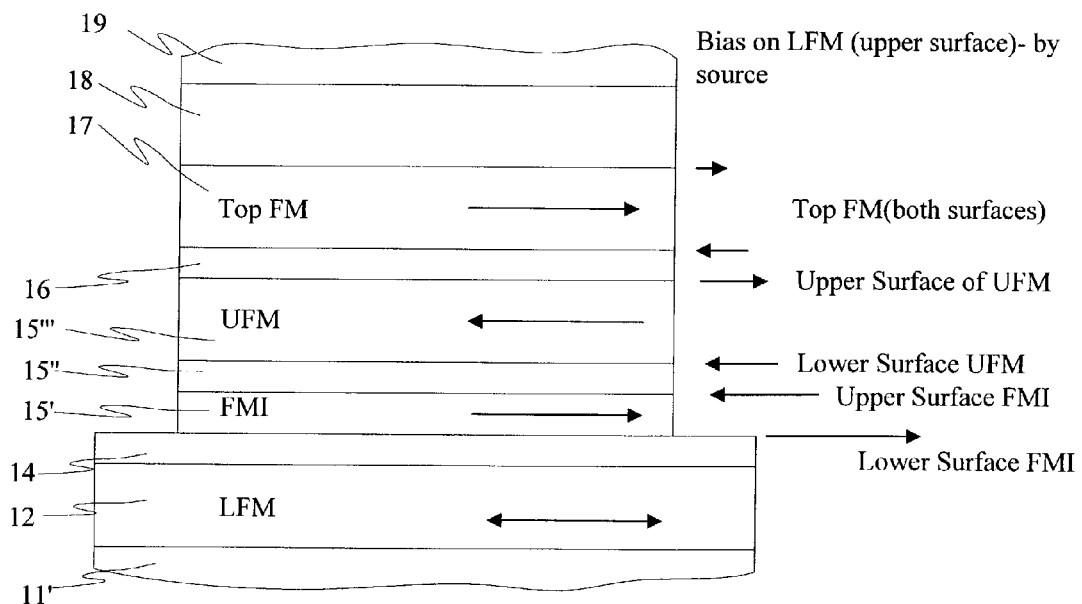
FIG. 6 shows a layer stack representation diagram embodying the present invention.

The coupling fields on the upper surface of the LFM are indicated to the right in analytical diagram portion of FIG. 6. As the distance from the LFM increases, the bias effects from the surfaces of the ferromagnetic material layers thereabove decreases. The bias effect from the lower surface of the FMI on the upper surface of the LFM will be somewhat larger than the effect from the upper surface of the FMI thereon, and so would lead to a small coupling field to the right. Coupling fields from the layers even further up the stack decrease with distance and alternate in sign as shown to thereby partially offset one another, thus producing only small effects. The bias effect from the lower surface of the UFM layer on the upper surface of the LFM will be in the same direction as the bias effect of the upper surface of the FMI thereon, to the extent, that with a properly selected thickness for the FMI, the net coupling field can be selectively reduced or nulled or even reversed. The bias effects of these two surfaces on the upper surface of the LFM, the top surface of the FMI and the bottom surface of the UFM, can be made larger (thinner FMI) or smaller (thicker FMI) to compensate for the bias effect of the bottom surface of the FMI on the upper surface of the LFM. If the net field from the modified pinned synthetic antiferromagnet is to be made equal to zero, the thickness of the UFM must be larger than the thickness of the other ferromagnetic material layer adjacent to the antiferromagnetic material layer in the SAF by the thickness of the FMI (assuming materials of the same magnetic moment in each of these layers).

Figure 1:
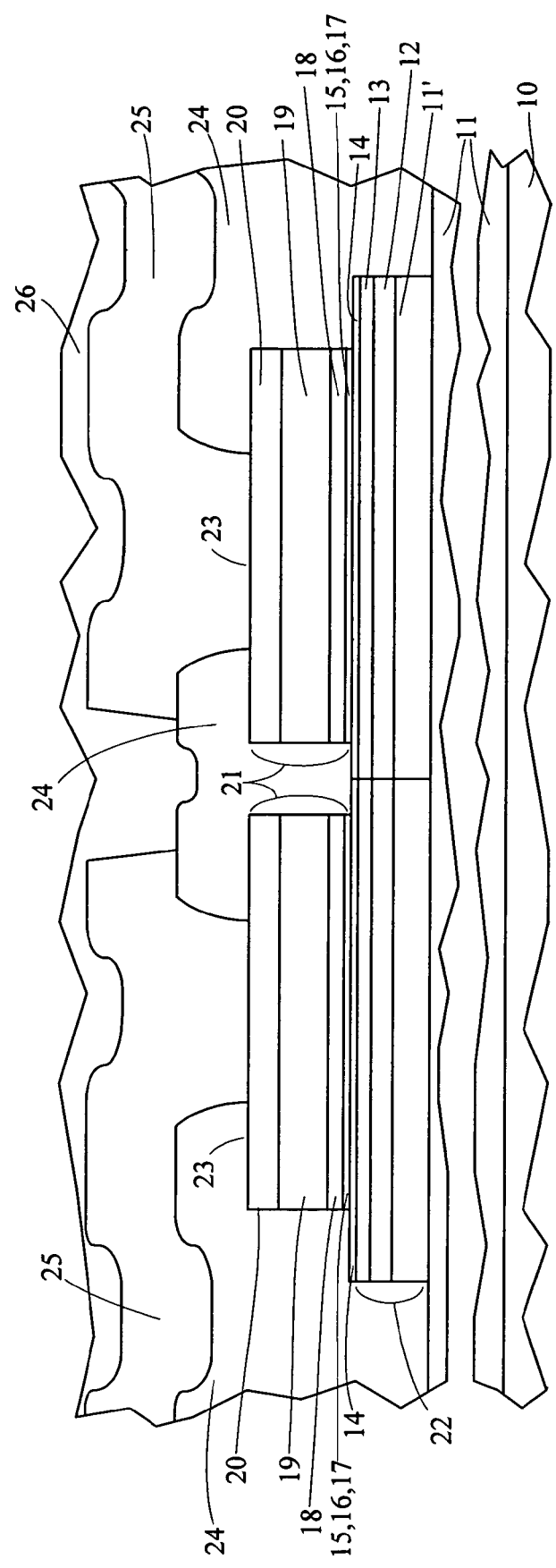
FIG. 1 shows a layer diagram of a spin dependent tunneling device formed in a monolithic integrated circuit with a silicon based monolithic integrated circuit portion serving as a device substrate.
Figure 2A:
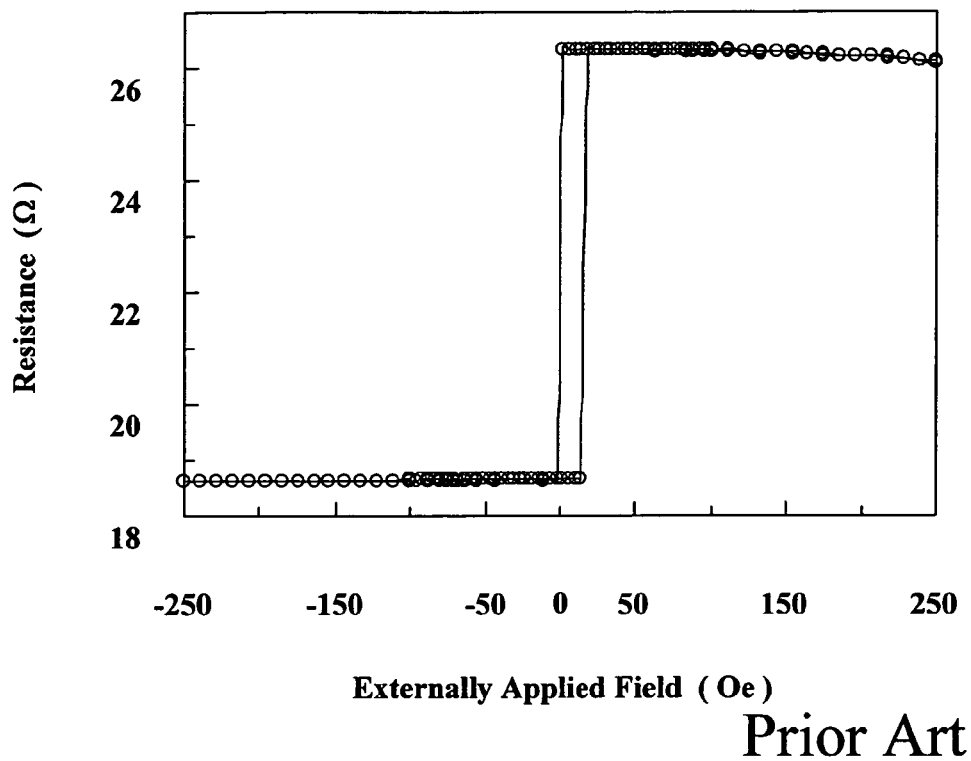
FIG. 2A shows a graph of a magnetoresistance vs. externally applied magnetic field characteristic for a conventional spin dependent tunneling device.
Figure 2B:
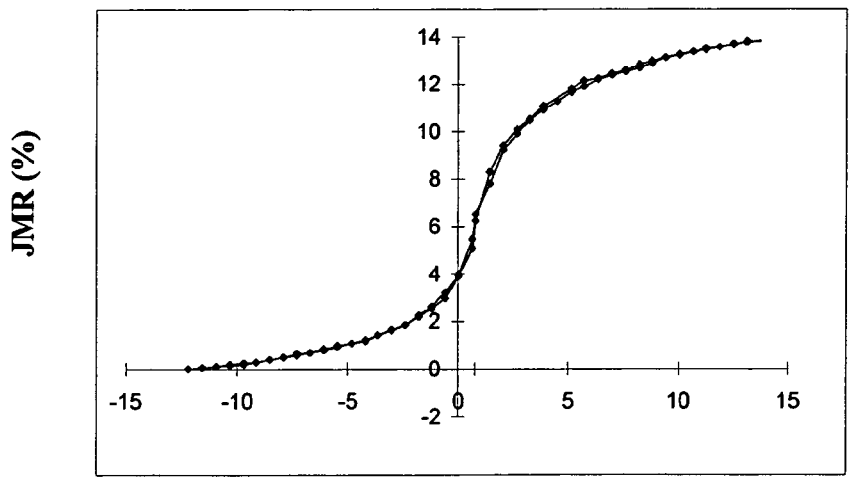
FIG. 2B shows a graph of a magnetoresistance vs. externally applied magnetic field characteristic for a biased conventional spin dependent tunneling device.
Figure 7:
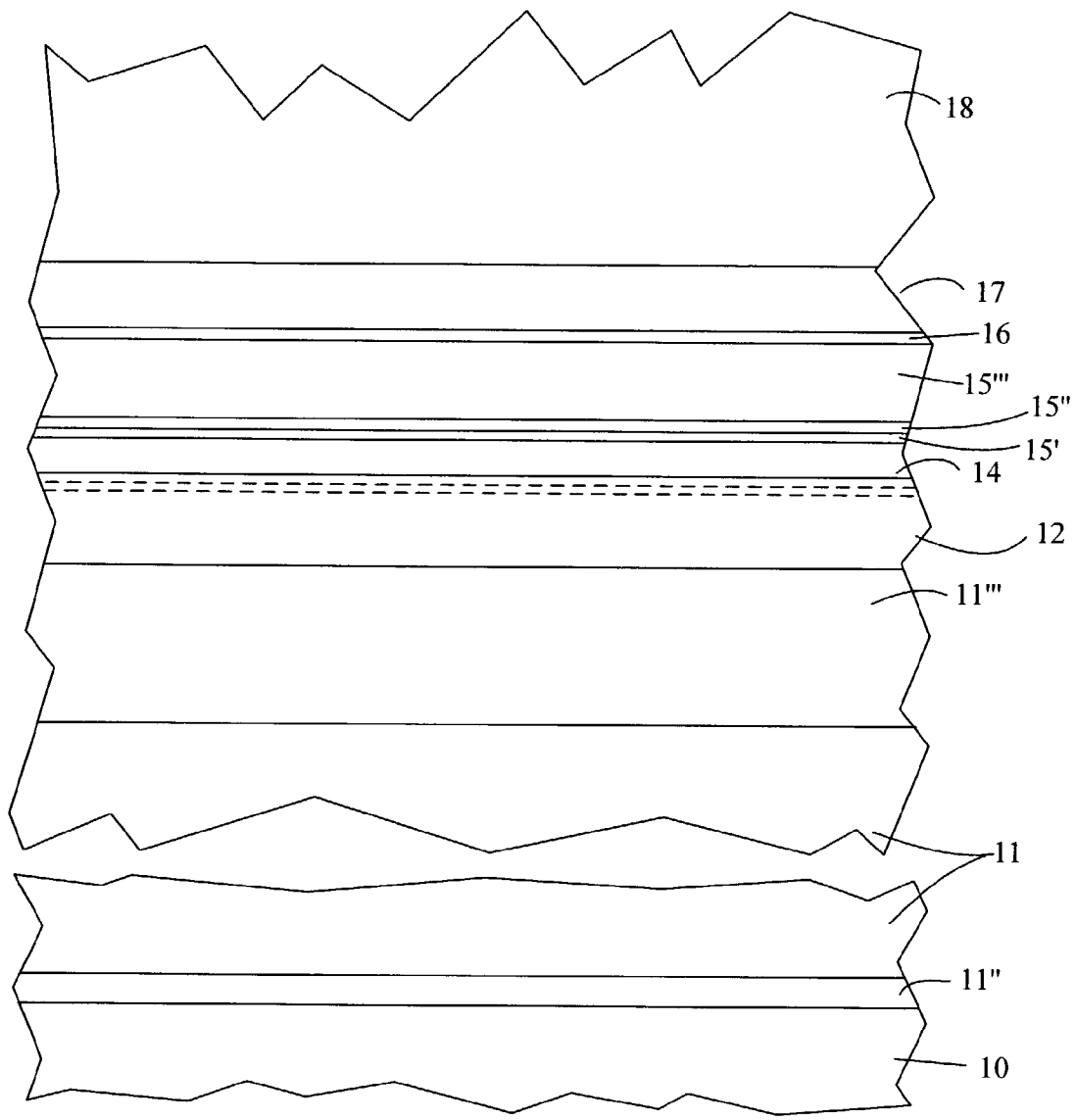
FIG. 7 shows a layer diagram of a portion of a device of the present invention.

Turning to the detailed structure of such a spin dependent tunneling sensing device as represented in FIG. 6, FIG. 7 shows a layer diagram of a portion of such a device on both sides of the barrier layer as supported on a monolithic integrated circuit wafer that is to a considerable extent like the spin dependent tunneling device of FIG. 1. Here too, FIG. 7 is not true cross section view in that many dimensions therein are exaggerated or reduced for purposes of clarity. The underlying substrate for the improved spin dependent tunneling sensing devices is typically again a semiconductor material based monolithic integrated circuit chip 10, here as part of a monolithic integrated circuit wafer in fabrication, having just a top surface portion thereof shown that is the passivation layer for the wafer chips as such chips are typically passivated with about 500 nm of silicon dioxide or $SiO_2$. Substrate 10 typically has monolithic integrated circuit components integrated therein for operation of the sensing device supported thereon. Subsequently formed vias in the passivating $SiO_2$ connect such circuit components with these sensing devices to operate them and receive signals from them. Electrical insulating layer 11 is formed again on semiconductor wafer chip 10 but here is preceded by providing first a 50 nm tantalum nitride (TaN) etch-stop layer, 11", on the passivation layer surface of wafer chip 10. Thereafter, electrical insulating layer 11 is provided on this etch-stop layer as a 200 nm silicon nitride ($Si_3N_4$) layer both by sputter deposition. Together, chip 10, and layers 11" and 11, form an electrical insulating substrate that supports and provides a suitable surface for the spin dependent tunneling sensing devices next to be formed.

A NiFeCo layer is next provided on electrical insulating layer 11 to form free magnetic layer 12 as the bottom electrode for these spin dependent tunneling sensing devices, and which is also the LFM in the corresponding layer representation stack diagram of FIG. 6. NiFeCo layer 12 is provided by RF sputter deposition to a thickness of 12 nm with a composition of 65% nickel (Ni), 15% iron (Fe) and 20% cobalt (Co).

$Al_2O_3$ tunnel barrier layer 14 is next formed by sputter deposition of 1.2 nm thick layer of aluminum onto the exposed surface portions of layer 12. (If, however, the device represented in the layer representation stack diagram of FIG. 4B was being fabricated instead of the one represented in FIG. 6, a 0.9 nm ruthenium antiparallel coupling layer and a 1.5 nm NiFeCo coupling compensation layer insert—shown by dashed lines in FIG. 7—would first be sputter deposited on layer 12 prior to the deposition of aluminum for forming the barrier layer and the corresponding layers deposited after the barrier layer is formed as described below would be omitted.) After this deposition, the aluminum layer is oxidized in a plasma of $Ar/O_2$. The amount of oxygen in the sputter gas controls, in part, the oxygen content of the resulting Al2O3. The initially unoxodized aluminum layer expands by approximately 30% as a result of being oxidized.

A composite magnetically "hard" layer is next provided as the synthetic antiferromagnet on top of tunnel barrier layer 14 as the basis for providing pinned reference layer upper electrodes, but here is modified to also arrange for reduction or elimination of a topological coupling based effective bias field on layer 12. Compound ferromagnetic "hard" layer 15,16,17 is next provided on oxidized tunnel barrier layer 14 through further sputter deposition but with layer 15 from FIG. 1 modified to have the ferromagnetic insert layer included therewith. Thus, a ferromagnetic insert layer, 15', of NiFeCo is deposited, in the same proportions, to a 1.5 nm thickness to be layer FMI in the layer representation stack diagram of FIG. 6. An antiferromagnetic coupling layer, 15", of Ru is then deposited to a 0.9 nm thickness. Then, the synthetic antiferromagnet begins by sputter deposition starting with depositing a first ferromagnetic layer, 15''', therefor of NiFeCo, in the same proportions, to a thickness of 6.5 nm which is deposited in the presence of an easy axis direction determination magnetic field of 20 Oe which is aligned with the intended length of layer 12 in the common bottom electrode (but could be alternatively aligned in the perpendicular direction in the plane of the layer depending on the device characteristics desired). Layer 15''' serves as layer UFM in the layer representation stack diagram of FIG. 6 and insert layer 15' is less than half as thick as layer 15'''. Then nonmagnetic layer 16 of ruthenium (copper could alternatively be used) is sputter deposited (no orienting magnetic field needed in this instance) to provide a Ru antiferromagnetic coupling layer of 0.9 nm thickness. Thereafter, ferromagnetic layer 17 of NiFeCo in the same proportions is deposited to a thickness of 5 nm and again in the presence of an easy axis direction determination magnetic field aligned as was the field for layer 15.

The deposition of very thin ferromagnetic insert layers such as layer 15' may lead to incompletely formed layers, i.e ferromagnetic "platelets", and Ru or other nonmagnetic materials, at the tunnel barrier. This is not necessarily a problem for the spin dependent tunneling structures. The reduction in magnetic coupling still takes place. Also, the magnetoresistance may not suffer either if the nonferromagnetic material in the tunnel barrier is oxidized or has sufficiently low conductivity to cause the majority of the tunneling current to pass through the ferromagnetic material at the tunnel barrier interface with the ferromagnetic insert layer even if in platelet form.

A further antiferromagnetic material "pinning" layer exhibiting a substantial magnetic anisotropy must be deposited on layer 17 to strongly set the magnetization direction of compound layer 15, 16, 17 in the direction in which the resulting sensor cell is intended to sense external magnetic fields during use as a sensor to thereby complete the magnetically "hard" reference layer. Such a layer has a strongly fixed magnetization direction which, through exchange coupling to layer 17, strongly fixes the direction of magnetization of that layer also, and so that of layer 15 through Ru layer 16. Hence, layer 18 of antiferromagnetic material $Cr_{45}Pt_{10}Mn_{45}$ is sputter deposited onto layer 17 to a thickness of 35 nm in the presence of a 20 Oe magnetization axis determination magnetic field aligned with the fields used in forming NiFeCo layers 15', 15''' and 17.

Post-deposition annealing of the finished spin dependent tunneling junction material layers stack is done in an ambient atmosphere at a temperature of 250° C. for one hour in the presence of an applied magnetic field of 4000 Oe that is applied parallel to the previous magnetization axis determination fabrication magnetic fields. This annealing serves to enhance the magnetic "hardness" of the composite hard layer by enhancing the exchange coupling between its strata 17 and 18. The anneal also improves the quality of the tunnel barrier layer 14.

Figure 8:
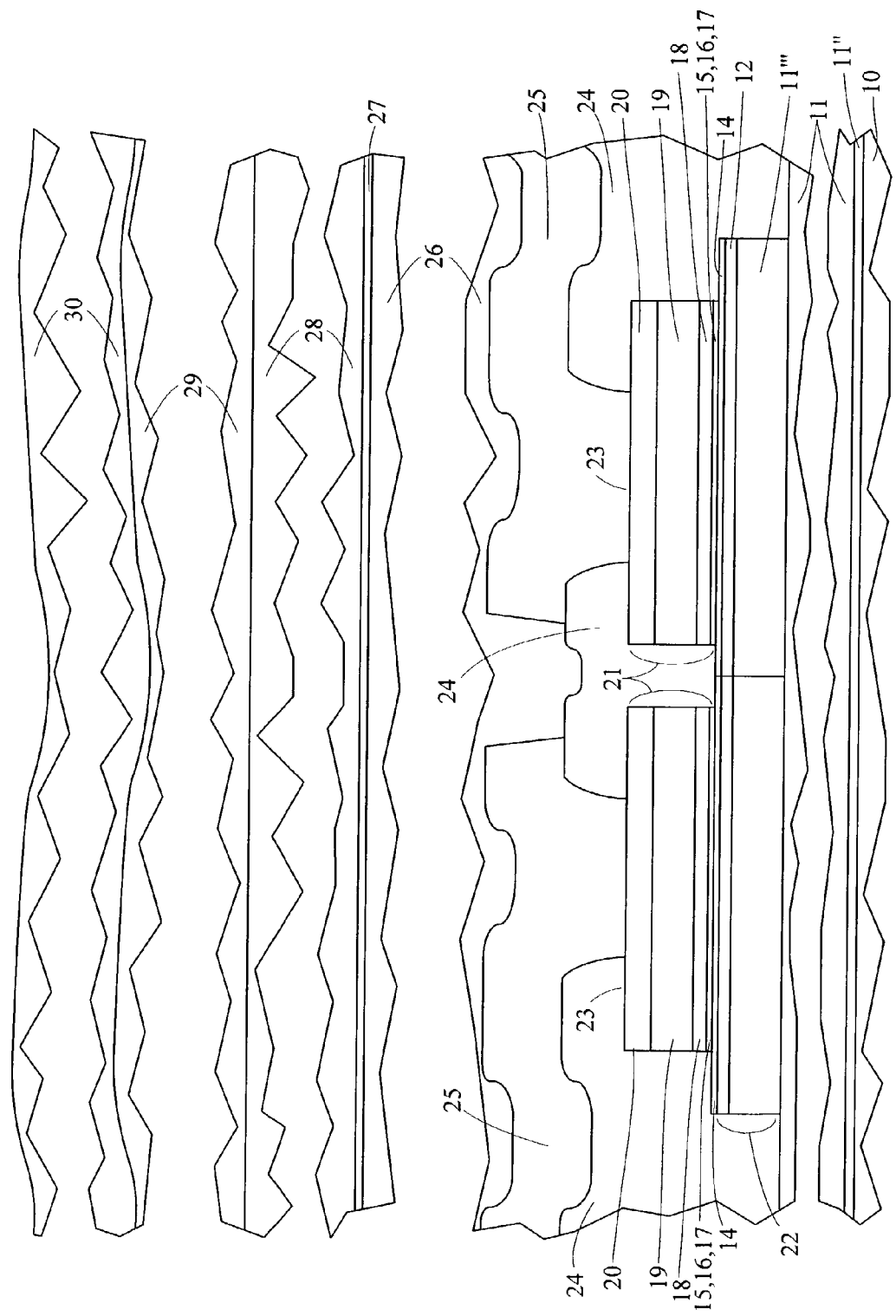
FIG. 8 shows a layer diagram of a larger portion of the device of FIG. 7 including the portion shown in that figure.

The wafer fabrication structure of a portion of a spin dependent tunneling sensor shown in shown in layer diagram form in FIG. 7 must undergo further fabrication steps to complete the fabrication of useful magnetoresistive sensors therefrom in monolithic integrated circuit chips. The result of such a spin dependent tunneling sensor fabrication process is shown in the layer diagram of FIG. 8. Prior to any etching of the wafer fabrication structure shown in FIG. 7, a conductive 10 nm thick Al layer for forming buffer layer 19, a 10 nm thick CrSi layer to form etch stop layer 20, and 75 nm thick $Si_3N_4$ hard-mask layer (not shown, as it is subsequently removed) are deposited onto antiferromagnetic material layer 18 of the magnetically "hard" composite layer using sputter deposition. A photoresist mask is formed using standard photolithographic techniques on the surface of the hard-mask layer in the wafer chip fabrication structure which hard-mask is then etched using reactive ion etching (RIE). This etching removes unmasked portions of the hard-mask material down to the layer that will form etch stop layer 16. The photoresist mask is removed, and the resulting wafer chip fabrication structure is further etched in an ion mill to remove those portions thereof down to tunnel barrier 14 that are uncovered by the remaining portions of the hard-mask. Thus, top electrodes 21 are formed by the ion mill removing the unmasked material down to tunnel barrier 14, and may thereby be provided with triangular shaped ends to reduce domain formation, and also to remove much of the 75 nm hard-mask layer from the areas previously masked thereby. The remnants of the silicon nitride hard-mask on the remaining portions of layer 20 and the now exposed portions of barrier layer 14 have a further silicon nitride layer sputter deposited thereon as a further hard-mask. Common bottom electrode 22 is then formed, which again can be shaped with triangular ends, using a similar process to mask and etch the exposed portions of tunnel barrier 14 and layer 12 providing the device free layer to stop on or within electrical insulating layer 11 to complete tunnel junction structure 23.

Tunnel junction structure top electrodes 21 and common bottom electrode 22 are passivated by sputter depositing electrical insulating passivation layer 24 of $Si_3N_4$ to a thickness of 100 nm. Contact window vias are formed in passivation layer 24 to expose portions of layers 20 using photolithography and RIE. Aluminum interconnections 25 are formed by sputter deposition of a 100 nm layer of Al onto passivating layer 24 and into windows exposing portions of layers 20 and subsequent patterning this layer into interconnections using photolithography and RIB. Thus, two tunnel junction structures 23 are formed each having a magnetically hard top electrode 21 as a pinned reference layer supported on barrier layer 14 supported in turn on common bottom electrode 22 so that they share this common bottom electrode serving as free magnetic layer 12. Although having two top electrodes per bottom electrode it is not necessary, this arrangement provides for better use of physical space in the resulting chip and an easier fabrication process.

At this point in the fabrication process, the magnetoresistive properties of the resulting spin dependent tunneling devices as thus far completed can be tested so as to measure at least some of the tunnel junction structures 23 magnetic response properties and circuit performances. The tunneling current resistance between the two adjacent magnetic material layers in the electrodes on either side of insulating barrier layer 14 depends on the relative angle between the directions of the magnetizations in these two magnetic material layers. This resistance is relatively small when the two magnetizations are parallel, and relatively large when they are antiparallel. The modified compound magnetic material layer 15, 16, 17 in top electrode 21, typically formed using NiFeCo therein, has its magnetization direction pinned using antiferromagnetic layer 18, typically formed using CrPtMn, positioned immediately on or next to it. Under relatively small externally applied magnetic fields, less than several hundred Oe, this pinned layer magnetization direction changes little. Therefore, an electrical signal can be obtained between the two electrodes by manipulating the magnetization magnitude and direction of the free layer formed by layer 12.

Additional layers must be deposited and patterned on the wafer chip fabrication structure having completed tunnel junction structures 23 therein to complete the desired spin dependent tunneling device chips which may done in some instances so as enable them to provide selected special capabilities. Thus, electrical isolation barrier layer 26 of $Si_3N_4$ is typically sputter deposited over interconnections 25 and the exposed portions of passavation layer 24. Here, however, as an example of forming a chip with a special capability, the sensing of electrical current in a chip supported electrical conductor coil, electrical isolation barrier layer 26 is provided with a surface conditioner layer, 27, thereon to directly support thereon a 1.5 micron thick Al planar coil, 28. A second electrical isolation barrier layer, 29, separates coil 28 from a permalloy magnetic field shield, 30, provided on layer 29. Isolation barrier 26 is formed here to a thickness from 2 μm to 18 μm by performing the following sequence one or more times: spin-coating benzocyclobutene (BCB) over interconnections 25 and the exposed portions of passavation layer 24 followed by prescribed soft bake. The top surface of BCB isolation barrier 26 supports 500 nm of $Si_3N_4$ as surface conditioning layer 27 that is formed by sputter deposition. The thickness chosen for isolation barrier 26 is determined by the required standoff voltage between coil 28 and interconnections 25 along with tunnel junction structures 23 for a particular use of such a chip arrangement. A typical extreme requirement for an electrical isolation application is 2500 Volts standoff, for which 18 μm of BCB is required. More typical magnetic field sensor uses need only 50 Volts standoff or so. Planar coil 28 is formed by standard photolithography and RIE etching of a layer of 1.5 microns of sputter-deposited Al.

Figure 9:
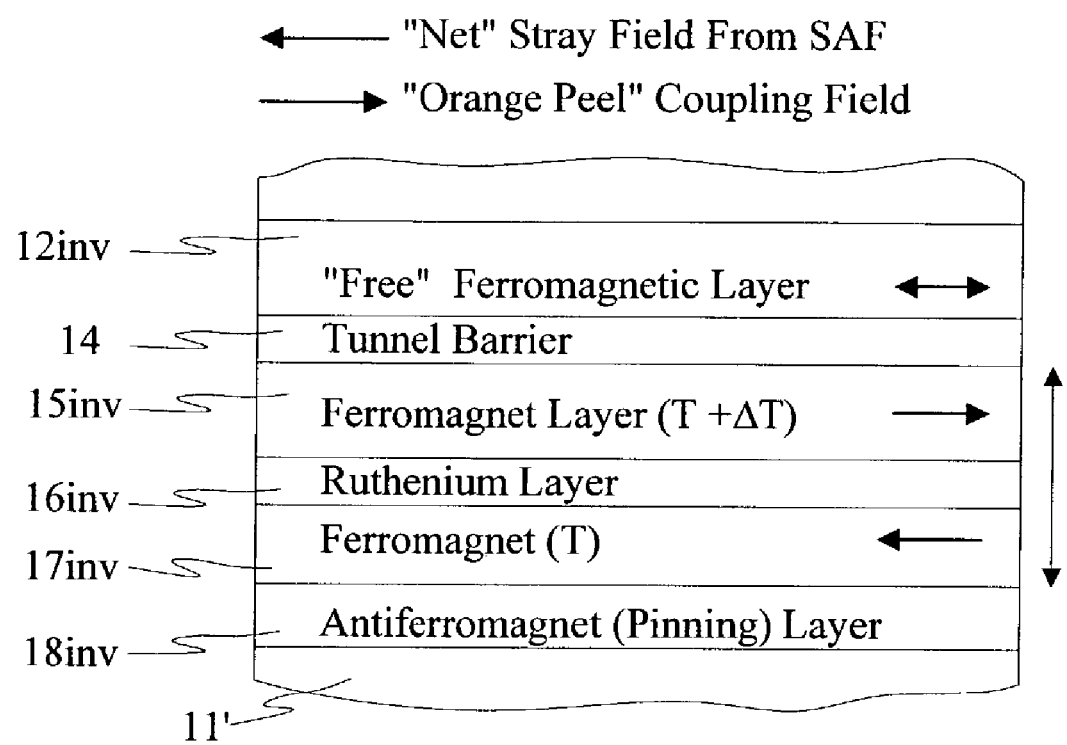
FIG. 9 shows an inverted version of the layer diagram of the spin dependent tunneling device of FIG. 1.

Turning now to memory cells, magnetoresistive spin dependent tunneling device random access memory cells typically use such a device in the cell with a pinned synthetic antiferromagnet to form a reference magnetization direction. A layer diagram of such a cell along with the magnetic fields acting on the "free" or unpinned ferromagnetic material layer in the spin dependent tunneling memory device are illustrated in the layer representation stack diagram of FIG. 9. For cells of sufficiently small dimensions (microns or less), the magnetic material anisotropy primarily giving rise to the basis for data storage is due to shape anisotropy, i.e. the difference in demagnetizing energies between the magnetization when directed across the short axis, or width, of the cell and when directed along the long axis or length of the cell. In memory cells, too, Néel coupling or topological coupling or "orange peel" coupling is the effect of a correlation of roughnesses of the ferromagnetic material free layer surface and the pinned ferromagnetic material layer in the synthetic antiferromagnet next to the tunneling barrier. The use of a synthetic antiferromagnet greatly reduces any stray magnetic fields emanating from the pinning layers therein because of providing a magnetic material closure path within that structure, but a commonly used technique is to make the magnetic material layer next to the barrier slightly thicker than the other magnetic material layer in the synthetic antiferromagnet. This arrangement provides an additional magnetic field as a stray field from the synthetic antiferromagnet to null out the "orange peel" coupling across the barrier as shown in FIG. 9. The spin dependent tunneling memory cell represented in the layer representation stack diagram of FIG. 9 shows the synthetic antiferromagnet therein formed on the bottom of the cell layer stack rather than on top, an alternative arrangement which can also be used as an alternative in any of the structures shown in FIGS. 3C, 4, 5, 6, 7 or 8. In FIG. 9, then, the order of the layers in the spin dependent tunneling device is reversed from the order shown in FIG. 1 with respect to barrier layer 14 and so the suffix "inv" for inverted is added after the device layers. Such nulling results in a memory cell that reduces or eliminates the "orange peel" coupling based effective bias field that otherwise leads to a preferred magnetic state in the cell. Thus, equal magnitude, oppositely directed externally applied magnetic fields can be used to switch the cell free layer magnetization to either of its two antiparallel directions along its anisotropy based easy axis.

A problem resulting from the use of magnetic material layers in the device synthetic antiferromagnet of unequal thicknesses as just described is the concomitant upsetting of the balance of the orange peel coupling and the nulling stray field from the asymmetrical synthetic antiferromagnet that will come about as a result of any changes from the desired dimensions of a memory cell such as occur due to fabrication process tolerances. The orange peel coupling in a spin dependent tunneling memory cell is roughly constant with the size of the barrier area between the synthetic antiferromagnet and the free layer, but the stray field from the synthetic antiferromagnet changes with changes in the synthetic antiferromagnet dimensions in being roughly in inverse proportion to the synthetic antiferromagnet length in being dependent on the separation between the free magnetic poles at the ends of the synthetic antiferromagnet magnetic material layers. Thus, changes in dimensions of such a memory cell will upset the desired stray field—"orange peel" coupling balance to leave a portion of the "orange peel" coupling either not nulled out or overly compensated to thereby again lead to a preferred one of the two cell magnetic states in needing different magnitude signals for switching than the other. Dimensional control during fabrication processing becomes more difficult as the cell size decreases which projects to this problem becoming worse in the future. The improved orange peel coupling reduction structures shown in any of FIGS. 4B, 5, 6, 7 or 8 (with the synthetic antiferromagnet in these structures alternatively provided either at the top or bottom of the device layer stack) can reduce the orange peel coupling to a very small level, i.e. adding a ferromagnetic material insert and an antiparallel coupling layer on one side or the other of barrier layer 14 in FIG. 9. This will allow the balancing of the synthetic antiferromagnet by making the two magnetic material layers in the device synthetic antiferromagnet of approximately equal magnetic moment, thus making the cell neutral with respect to externally applied magnetic fields, i.e. the cell will not have a significant tray stray field due to the synthetic antiferromagnet layers.

Assume that the normal values of w (the wavelength of the sinusoidal spatial roughness) is about 263 Å. The all-important exponential in the above equation for the magnetostatic coupling energy density J has an exponent of about −8.89 t/w. As an example, with the value of spacer layer thickness t set equal to 15 Å, and assuming the magnetizations and roughness are the same in all layers, some inference can be made about a selection of thicknesses for the ferromagnetic material insert layer and the accompanying Ru layer in the structure of FIGS. 6, 7 and 8. Let the "orange peel" coupling field from the bottom surface of the pinned magnetic material layer forming the FMI on one side of the barrier equal $H_{op}$. With a 15 Å thick ferromagnetic material layer for the FMI, the coupling field on the top surface of the FMI would have a value of about $(e^{-1/2})(H_{op})$. With a 7.5 Å Ru layer, the next nearest surface on the bottom of the UFM would give a coupling field in the same direction as the coupling field from the top surface of the FMI with a value of $(e^{-3/4})(H_{op})$. The net coupling field from these three surfaces are combined together to give the result $(1-e^{-1/2}-e^{-3/4})(H_{op})$, or $[1-0.606-0.472]H_{op}=-0.078\ H_{op}$ which would be a reversal of the normal sign for orange peel coupling. The other surfaces of magetic material layers in the synthetic antiferromagnet would have sharply reduced magnitudes of coupling because of larger separations from the LFM, and so are ignored for purposes of this illustration. Similar calculations for the structures shown in FIGS. 4B and 5 can be performed to infer layer thicknesses for the FMI and the accompanying RU layer shown added there.

Figure 10A:
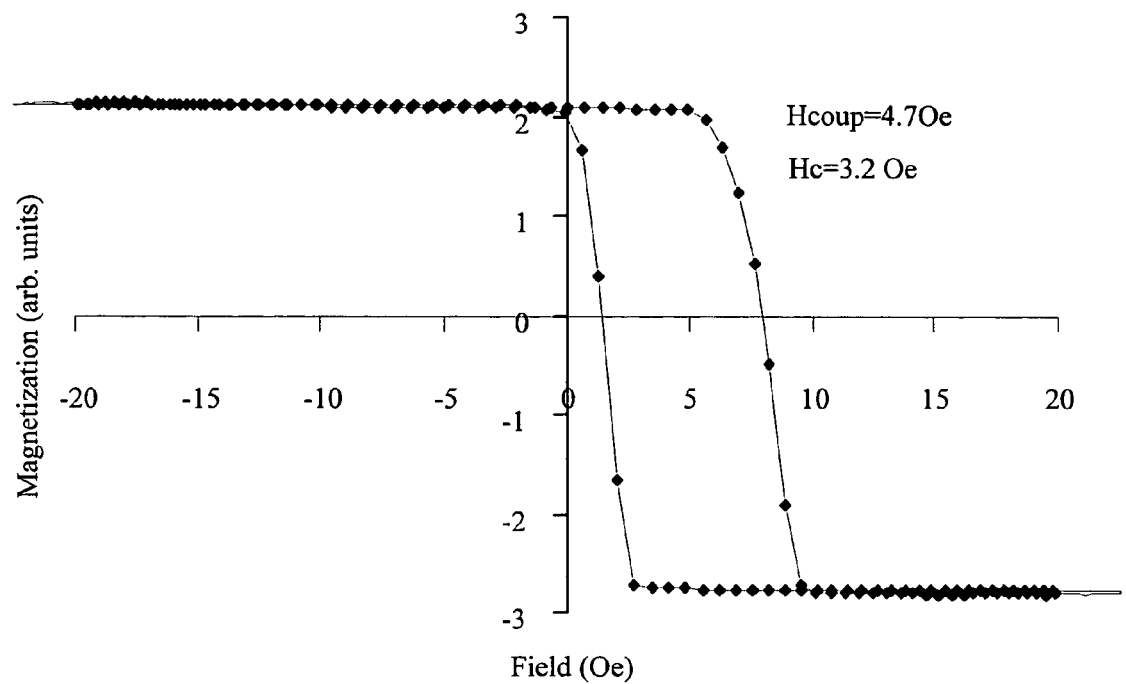
FIG. 10A shows a graph of a magnetoresistance vs. externally applied magnetic field characteristic for a device of the present invention.
Figure 10B:
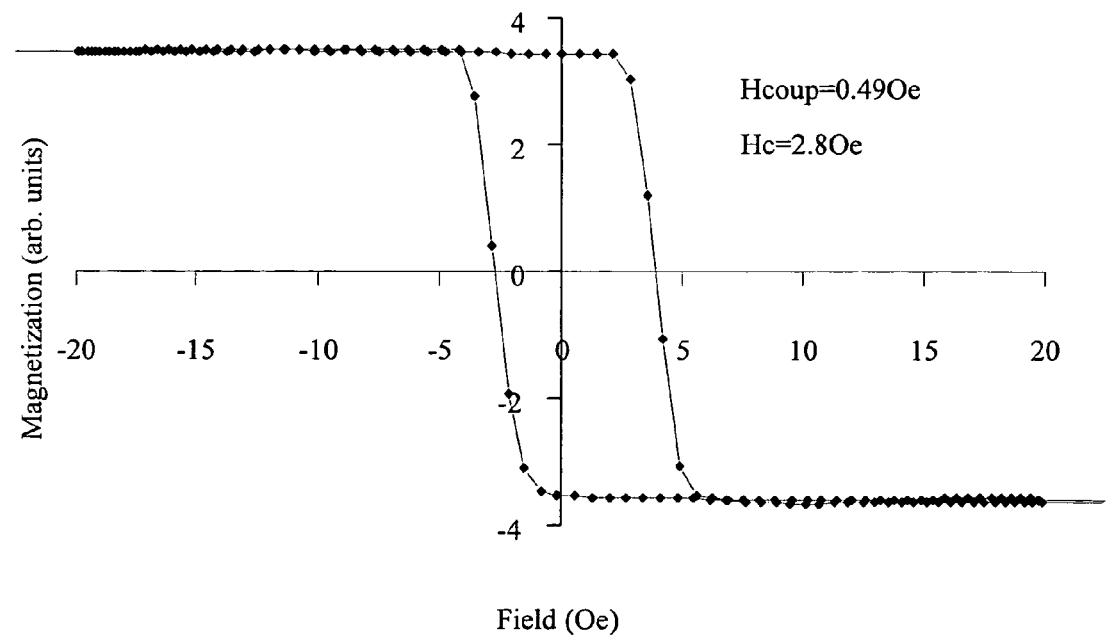
FIG. 10B shows a graph of a magnetoresistance vs. externally applied magnetic field characteristic for a device of the present invention.
Figure 11A:
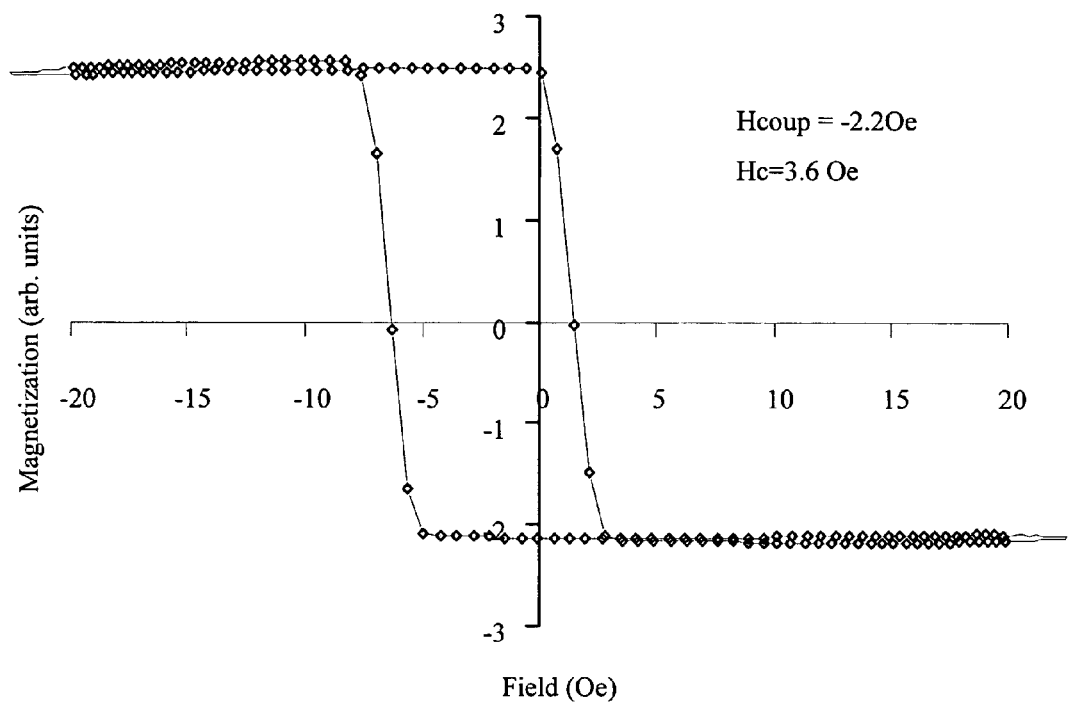
FIG. 11A shows a graph of a magnetoresistance vs. externally applied magnetic field characteristic for a device of the present invention.
Figure 11B:
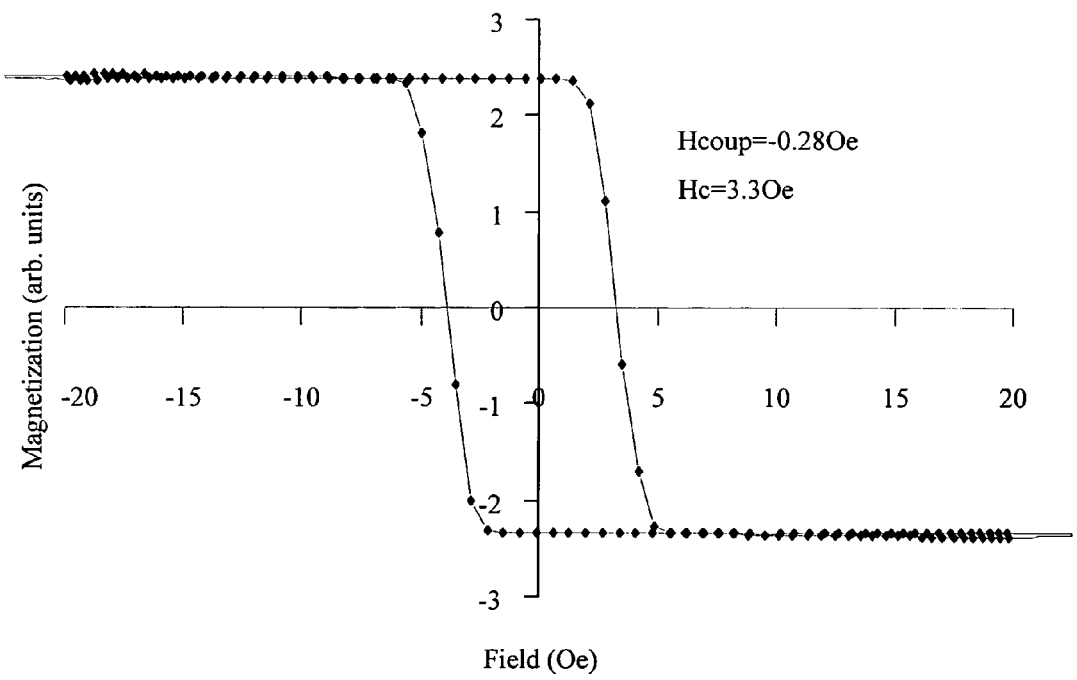
FIG. 11B shows a graph of a magnetoresistance vs. externally applied magnetic field characteristic for a device of the present invention.

Reduced orange peel coupling structures have been fabricated with the soft magnetic material free layer on the top and a pinned synthetic antiferromagnet on the bottom of the device layer stack and, in the alternative form, with the soft magnetic material free layer on the bottom and the pinned synthetic antiferromagnet on the top of the device layer stack. With respect to both forms, corresponding similar conventional device structures omitting the above described ferromagnetic material layer insert and an accompanying Ru layer gave much higher orange peel coupling across the barrier in the device than in the device structures with them present. For the form with the soft magnetic material free layer on top which is the inverted version of FIG. 6, the orange peel coupling for the inverted device version of FIG. 6 omitting the above described ferromagnetic material layer insert and the accompanying Ru layer was reduced from 4.7 Oe, as is shown in FIG. 10A (devices of a wafer having layers of 54 Å NiFeCo-328 Å CrPtMn-54 Å NiFeCo-11 Å Ru-54 Å NiFeCo-15 Å Al-AlO 240-120 Å NiFeCo-200 Å Al), to 0.49 Oe by going to the inverted version of FIG. 6 (i.e., with the above described ferromagnetic material layer insert and an accompanying Ru layer therein) as is shown in FIG. 10B (devices of a wafer having layers of 54 Å NiFeCo-328 Å CrPtMn-54 Å NiFeCo-11 Å Ru-65 Å NiFeCo-11 Å Ru-15 Å NiFeCo-15 Å Al-AlO 240-120 Å NiFeCo-200 Å Al). For the form with the soft magnetic material free layer on the bottom as in FIG. 6, the orange peel coupling for the version of FIG. 6 omitting the above described ferromagnetic material layer insert and the accompanying Ru layer was reduced from 3.6 Oe, as is shown in FIG. 11A (devices of a wafer having layers of 120 Å NiFeCo-15 Å Al-AlO 240-54 Å NiFeCo-328 Å CrPtMn-200 Å Al), to 0.28 Oe by going to the device version of FIG. 6 (i.e., with the above described ferromagnetic material layer insert and an accompanying Ru layer therein) as is shown in FIG. 11B (devices of a wafer having layers of 120 Å NiFeCo-15 Å Al-AlO 240-15 Å NiFeCo-11 Å Ru-65 Å NiFeCo-11 Å Ru-54 Å NiFeCo-328 Å CrPtMN-200 Å Al).

The novel coupling reduction structure has considerable advantages in an spin dependent tunneling structure because the spin dependent tunneling effect depends mostly on a very thin (a few atomic layers) region of ferromagnetic material on either side of the tunnel barrier. Thus, even a quite thin ferromagnetic insert can result in a device with good magnetoresistance characteristics.

A similar magnetic coupling reduction effect can be produced in a "giant magnetoresistive effect" device structure, where the layer separating two ferromagnetic structures is a conductive material like copper rather than insulating. However, there may be a reduced performance in such a structure because of it being provided with such a high resistance interface (Fe/Ru/Fe) so close to the nonmagnetic intermediate layer. The overall sheet resistance of this material would go up while the applied field responsive change in the device magnetoresistance would not likely increase. Thus, the device output signal is likely to decrease somewhat from its typical values in such devices which are not provided with topological coupling compensation.

Although the present invention has been described with reference to preferred embodiments, workers skilled in the art will recognize that changes may be made in form and detail without departing from the spirit and scope of the invention.

The invention claimed is:

1. A ferromagnetic thin-film based magnetic device including a sequence of layers between opposite ends thereof provided so as to have internal film coupling compensation, said device comprising:

a nonmagnetic material intermediate layer, said intermediate layer having two major surfaces on opposite sides thereof substantially parallel to said opposite ends;

an initial thin-film of an anisotropic ferromagnetic material against one of said intermediate layer major surfaces;

a compensation thin-film of an anisotropic ferromagnetic material against that remaining one of said intermediate layer major surfaces;

an antiparallel coupling layer against said compensation thin-film;

a subsequent thin-film of an anisotropic ferromagnetic material against said antiparallel coupling layer with said compensation thin-film being less thick than said initial thin-film and less than half as thick as said subsequent thin film, and of thickness sufficient to provide a substantially zero bias value in its magnetoresistance versus externally applied magnetic fields characteristic while free of biasing magnetic fields applied to provide that bias value from a source located so as to be intersected by a plane extendable through any of said initial, compensation or subsequent thin-films parallel to said major surfaces; and an electrode in electrical contact with said device on at least part of one of said ends thereof wherein said thickness of said compensation thin-film is selected such that effective bias magnetic fields thereon and on a selected one of said initial or subsequent thin-films effectively cancel so as to provide said substantially zero bias value.

2. The device of claim 1 wherein said initial thin-film comprises a magnetization reference layer having a relatively fixed magnetization direction.

3. The apparatus of claim 2 wherein said magnetization reference layer is a composite layer and, in addition to said ferromagnetic material layer therein, further comprises an antiferromagnetic material layer therein.

4. The apparatus of claim 2 wherein at least one of said intermediate layer, said initial thin-film, said compensation thin-film, said antiparallel coupling layer and said subsequent thin-film have a length along a selected direction and a width substantially perpendicular thereto that is smaller in extent than said length, and said magnetization reference layer has said relatively fixed magnetization direction thereof along said width.

5. The apparatus of claim 2 wherein at least one of said intermediate layer, said initial thin-film, said compensation thin-film, said antiparallel coupling layer and said subsequent thin-film have a length along a selected direction and a width substantially perpendicular thereto that is smaller in extent than said length, and said magnetization reference layer has said relatively fixed magnetization direction thereof along said length.

6. The device of claim 1 wherein said subsequent thin-film comprises a magnetization reference layer having a relatively fixed magnetization direction.

7. The apparatus of claim 6 wherein said magnetization reference layer is a composite layer and, in addition to said ferromagnetic material layer therein, further comprises an antiferromagnetic material layer therein.

8. The apparatus of claim 6 wherein at least one of said intermediate layer, said initial thin-film, said compensation thin-film, said antiparallel coupling layer and said subsequent thin-film have a length along a selected direction and a width substantially perpendicular thereto that is smaller in extent than said length, and said magnetization reference layer has said relatively fixed magnetization direction thereof along said width.

9. The apparatus of claim 6 wherein at least one of said intermediate layer, said initial thin-film, said compensation thin-film, said antiparallel coupling layer and said subsequent thin-film have a length along a selected direction and a width substantially perpendicular thereto that is smaller in extent than said length, and said magnetization reference layer has said relatively fixed magnetization direction thereof along said length.

10. The device of claim 1 wherein said subsequent thin-film is a first magnetization reference layer having a relatively fixed magnetization direction, and further comprising a second magnetization reference layer provided on that same side of one of said nonmagnetic intermediate layer major surfaces as said first magnetization reference layer, and also having a relatively fixed magnetization direction.

11. The device of claim 1 wherein at least one of said intermediate layer, said initial thin-film, said compensation thin-film, said antiparallel coupling layer and said subsequent thin-film have a length along a selected direction and a width substantially perpendicular thereto that is smaller in extent than said length, and has a shaped end portion extending over a portion of said length in which said width gradually reduces to zero at that end thereof.

12. The device of claim 1 wherein a said nonmagnetic intermediate layer is an electrically conducting layer.

13. The device of claim 1 wherein a said nonmagnetic intermediate layer is an electrically insulative layer.

14. The device of claim 1 further comprising a substrate supporting remaining portions thereof formed of a monolithic integrated circuit.

15. A ferromagnetic thin-film based magnetic device including a sequence of layers between opposite ends thereof provided so as to have internal film coupling compensation, said device comprising:

a nonmagnetic material intermediate layer, said intermediate layer having two major surfaces on opposite sides thereof substantially parallel to said opposite ends;

a first reference thin-film of an anisotropic ferromagnetic material against one of said intermediate layer major surfaces;

a first antiparallel coupling layer against said first reference thin-film;

a second reference thin-film of an anisotropic ferromagnetic material against said first antiparallel coupling layer;

a locking layer of an antiferromagnetic material against said second reference thin-film, said first and second reference thin-films and said locking layer together having a relatively fixed magnetization direction;

a compensation thin-film against that remaining one of said intermediate layer major surfaces of an anisotropic ferromagnetic material;

a second antiparallel coupling layer against said compensation thin-film;

a subsequent thin-film of an anisotropic ferromagnetic material against said second antiparallel coupling layer with said compensation thin-film being less thick than said initial thin-film and less than half as thick as said subsequent thin-films and of thickness sufficient to provide a substantially zero bias value in its magnetoresistance versus externally applied magnetic fields characteristic while free of biasing magnetic fields applied to provide that bias value from a source located so as to be intersected by a plane extendable through any of said initial, compensation or subsequent thin-films parallel to said major surfaces; and an electrode in electrical contact with said device on at least part of one of said ends thereof wherein said thickness of said compensation thin-film is selected such that effective bias magnetic fields thereon and on said subsequent thin-film effectively cancel so as to provide said substantially zero bias value.

16. The device of claim 15 wherein at least one of said intermediate layer, said first reference thin-film, said first antiparallel coupling layer, said second reference thin-film, said locking layer said compensation thin-film, said second antiparallel coupling layer and said subsequent thin-film have a length along a selected direction and a width substantially perpendicular thereto that is smaller in extent than said length, and has a shaped end portion extending over a portion of said length in which said width gradually reduces to zero at that end thereof.

17. The device of claim 15 wherein a said nonmagnetic intermediate layer is an electrically conducting layer.

18. The device of claim 15 wherein a said nonmagnetic intermediate layer is an electrically insulative layer.

19. The device of claim 15 further comprising a substrate supporting remaining portions thereof formed of a monolithic integrated circuit.

20. The apparatus of claim 15 wherein at least one of said intermediate layer, said first reference thin-film, said first antiparallel coupling layer, said second reference thin-film, said locking layer, said compensation thin-film, said second antiparallel coupling layer and said subsequent thin-film have a length along a selected direction and a width substantially perpendicular thereto that is smaller in extent than said length, and said first and second reference thin-films and said locking layer together have said relatively fixed magnetization direction thereof along said width.

21. The apparatus of claim 15 wherein at least one of said intermediate layer, said first reference thin-film, said first antiparallel coupling layer, said second reference thin-film, said locking layer, said compensation thin-film, said second antiparallel coupling layer and said subsequent thin-film have a length along a selected direction and a width substantially perpendicular thereto that is smaller in extent than said length, and said first and second reference thin-films and said locking layer together have said relatively fixed magnetization direction thereof along said length.

22. A ferromagnetic thin-film based magnetic device including a sequence of layers between opposite ends thereof provided so as to have internal film coupling compensation, said device comprising:

a nonmagnetic material intermediate layer, said intermediate layer having two major surfaces on opposite sides thereof substantially parallel to said opposite ends;

an initial thin-film of an anisotropic ferromagnetic material against one of said intermediate layer major surfaces;

a compensation thin-film against that remaining one of said intermediate layer major surfaces of an anisotropic ferromagnetic material;

a first antiparallel coupling layer against said compensation thin-film;

a first reference thin-film of an anisotropic ferromagnetic material against said first antiparallel coupling layer with said compensation thin-film being less thick than said subsequent thin-film and less than half as thick as said initial thin-film, and of thickness sufficient to provide a substantially zero bias value in its magnetoresistance versus externally applied magnetic fields characteristic while free of biasing magnetic fields applied to provide that bias value from a source located so as to be intersected by a plane extendable through any of said initial, compensation or subsequent thin-films;

a second antiparallel coupling layer against said first reference thin-film;

a second reference thin-film of an anisotropic ferromagnetic material against said second antiparallel coupling layer;

a locking layer of an antiferromagnetic material against said second reference thin-film, said first and second reference thin-films and said locking layer together having a relatively fixed magnetization direction; and an electrode in electrical contact with said device on at least part of one of said ends thereof wherein said thickness of said compensation thin-film is selected such that effective bias magnetic fields thereon and on said initial thin-film effectively cancel so as to provide said substantially zero bias value.

23. The device of claim 22 wherein at least one of said intermediate layer, said initial thin-film, said compensation thin-film, said first antiparallel coupling layer, said first reference thin-film, said second antiparallel coupling layer, said second reference thin-film and said locking layer have a length along a selected direction and a width substantially perpendicular thereto that is smaller in extent than said length, and has a shaped end portion extending over a portion of said length in which said width gradually reduces to zero at that end thereof.

24. The device of claim 22 wherein a said nonmagnetic intermediate layer is an electrically conducting layer.

25. The device of claim 22 wherein a said nonmagnetic intermediate layer is an electrically insulative layer.

26. The device of claim 22 further comprising a substrate supporting remaining portions thereof formed of a monolithic integrated circuit.

27. The apparatus of claim 22 wherein at least one of said intermediate layer, said initial thin-film, said compensation thin-film, said first antiparallel coupling layer, said first reference thin-film, said second antiparallel coupling layer, said second reference thin-film and said locking layer have a length along a selected direction and a width substantially perpendicular thereto that is smaller in extent than said length, and said first and second reference thin-films and said locking layer together have said relatively fixed magnetization direction thereof along said width.

28. The apparatus of claim 22 wherein at least one of said intermediate layer, said initial thin-film, said compensation thin-film, said first antiparallel coupling layer, said first reference thin-film, said second antiparallel coupling layer, said second reference thin-film and said locking layer have a length along a selected direction and a width substantially perpendicular thereto that is smaller in extent than said length, and said first and second reference thin-films and said locking layer together have said relatively fixed magnetization direction thereof along said length.

29. A ferromagnetic thin-film based magnetic device including a sequence of layers between opposite ends thereof provided so as to have internal film coupling compensation, said device comprising:

a nonmagnetic material intermediate layer, said intermediate layer having two major surfaces on opposite sides thereof substantially parallel to said opposite ends;

an initial thin-film of an anisotropic ferromagnetic material against one of said intermediate layer major surfaces;

a compensation thin-film of an anisotropic ferromagnetic material against that remaining one of said intermediate layer major surfaces;

an antiparallel coupling layer against said compensation thin-film;

a subsequent thin-film of an anisotropic ferromagnetic material against said antiparallel coupling layer with said compensation thin-film being less thick than both of, and less than half as thick as a selected one of, said initial and subsequent thin-films, and of thickness sufficient to provide a selected bias value in its magnetoresistance versus externally applied magnetic fields characteristic while free of biasing magnetic fields applied to provide that bias value from a source located so as to be intersected by a plane extendable through any of said initial, compensation or subsequent thin-films parallel to said major surfaces;

a locking layer of an antiferromagnetic material in said sequence of layers between said opposite ends of said device with said device otherwise free of any antiferromagnetic material layers therein;

a first reference thin-film of an anisotropic ferromagnetic material against said single locking layer so as to be against only one layer containing a ferromagnetic material, said first reference thin-film and said locking layer together having a relatively fixed magnetization direction, and an electrode in electrical contact with said device on at least part of one of said ends thereof wherein said thickness of said compensation thin-film is selected such that effective bias magnetic fields thereon and on a selected one of said initial or subsequent thin-films effectively cancel so as to provide said selected bias value.

30. The device of claim 29 further comprising a reference antiparallel coupling layer against both said first reference layer and said initial thin-film.

31. The device of claim 29 further comprising a reference antiparallel coupling layer against both said first reference layer and said subsequent thin-film.

32. The device of claim 29 wherein one of said initial and compensation thin-films is a first one thereof, and further comprising a second one thereof provided against that same one of said nonmagnetic intermediate layer major surfaces as said first one thereof.

33. The device of claim 29 wherein at least one of said intermediate layer, said initial thin-film, said compensation thin-film, said antiparallel coupling layer and said subsequent thin-film have a length along a selected direction and a width substantially perpendicular thereto that is smaller in extent than said length, and has a shaped end portion extending over a portion of said length in which said width gradually reduces to zero at that end thereof.

34. The device of claim 29 wherein a said nonmagnetic intermediate layer is an electrically conducting layer.

35. The device of claim 29 wherein a said nonmagnetic intermediate layer is an electrically insulative layer.

36. The device of claim 29 further comprising a substrate supporting remaining portions thereof formed of a monolithic integrated circuit.

* * * * *